United States Patent
Heo et al.

(10) Patent No.: US 10,297,687 B2
(45) Date of Patent: May 21, 2019

(54) SEMICONDUCTOR DEVICE INCLUDING VERTICAL-TYPE FIELD EFFECT TRANSISTORS AND METHOD OF FABRICATING THE SAME

(71) Applicant: SAMSUNG ELECTRONICS CO., LTD., Suwon-si, Gyeonggi-do (KR)

(72) Inventors: Yeoncheol Heo, Suwon-si (KR); Sharma Deepak, Suwon-si (KR); Kwanyoung Chun, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/821,116

(22) Filed: Nov. 22, 2017

(65) Prior Publication Data

US 2018/0151728 A1    May 31, 2018

(30) Foreign Application Priority Data

Nov. 29, 2016   (KR) .......................... 10-2016-0160797

(51) Int. Cl.
| | | |
|---|---|---|
| *H01L 29/423* | (2006.01) | |
| *H01L 29/10* | (2006.01) | |
| *H01L 29/78* | (2006.01) | |
| *H01L 27/092* | (2006.01) | |
| *H01L 29/06* | (2006.01) | |
| *H01L 21/8238* | (2006.01) | |
| *H01L 27/02* | (2006.01) | |

(52) U.S. Cl.
CPC .. *H01L 29/7827* (2013.01); *H01L 21/823885* (2013.01); *H01L 27/0207* (2013.01); *H01L 27/092* (2013.01); *H01L 29/0649* (2013.01); *H01L 29/1037* (2013.01); *H01L 29/42392* (2013.01)

(58) Field of Classification Search
CPC ........... H01L 29/7827; H01L 29/42392; H01L 29/0649; H01L 29/1037; H01L 27/092
See application file for complete search history.

(56) References Cited

U.S. PATENT DOCUMENTS

| | | |
|---|---|---|
| 7,851,842 B2 | 12/2010 | Cho |
| 8,803,229 B2 | 8/2014 | Forbes |
| 8,847,327 B2 | 9/2014 | Kato et al. |
| 9,034,704 B2 | 5/2015 | Balakrishnan et al. |
| 9,064,730 B2 | 6/2015 | Ellis et al. |
| 9,093,305 B2 | 7/2015 | Masuoka et al. |
| 9,245,989 B2 | 1/2016 | Then et al. |

(Continued)

*Primary Examiner* — Allen L Parker
*Assistant Examiner* — Gustavo G Ramallo
(74) *Attorney, Agent, or Firm* — F. Chau & Associates, LLC

(57) ABSTRACT

A semiconductor device includes a substrate with an upper surface and a lower surface, and first to third active patterns extending from the upper surface of the substrate. The first to third active patterns are arranged adjacent to each other in a first direction. The second active pattern is disposed between the first and third active patterns. The semiconductor device also includes a first gate electrode surrounding side surfaces of the first and second active patterns, and a second gate electrode surrounding side surfaces of the third active pattern. Each of the first to third active patterns includes a first impurity region, a channel region, and a second impurity region.

16 Claims, 22 Drawing Sheets

(56) References Cited

U.S. PATENT DOCUMENTS 9,425,201 B2 8/2016 Liaw
2011/0223731 A1* 9/2011 Chung ............... H01L 27/0207
438/270
2015/0333008 A1 11/2015 Gupta et al.

* cited by examiner

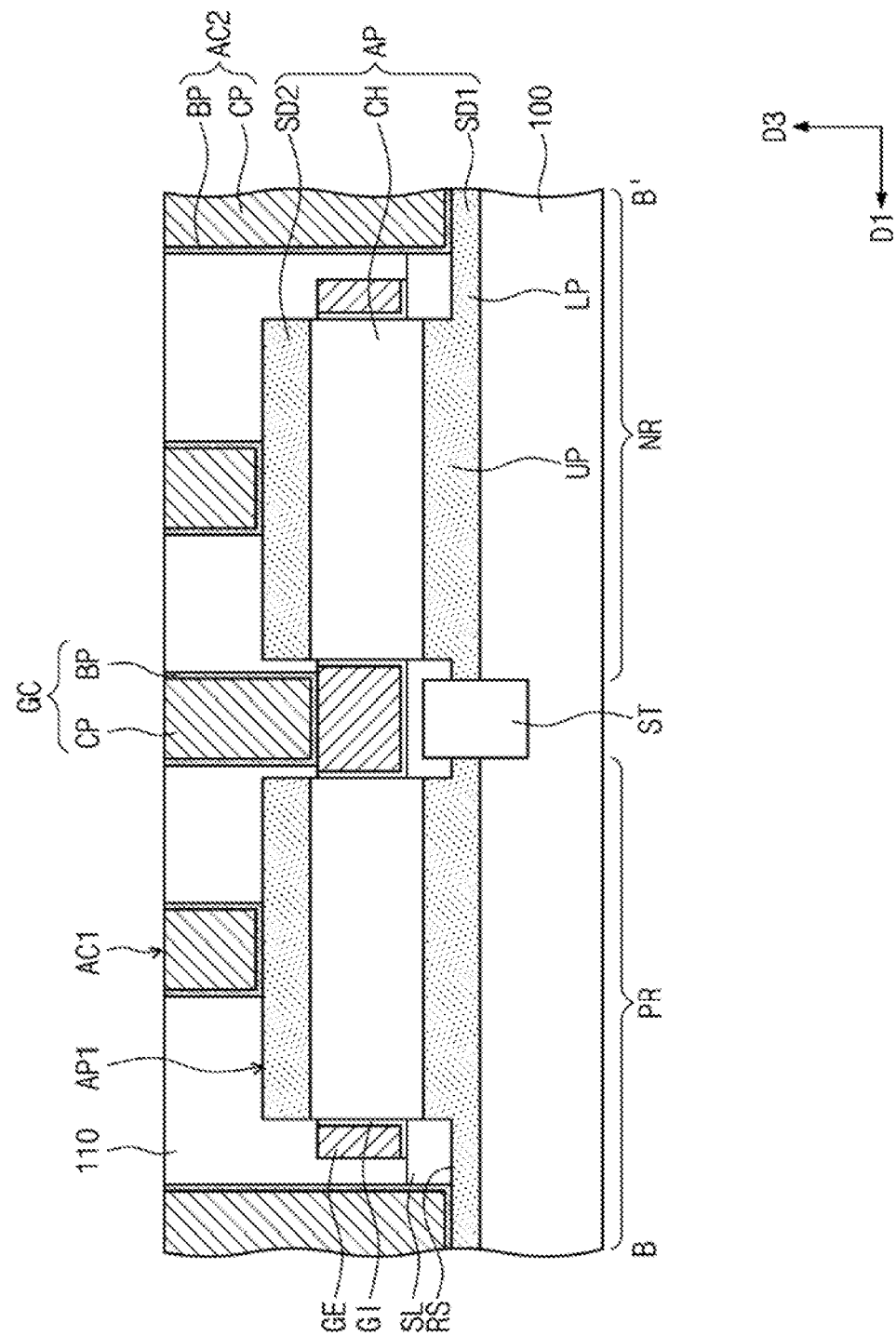

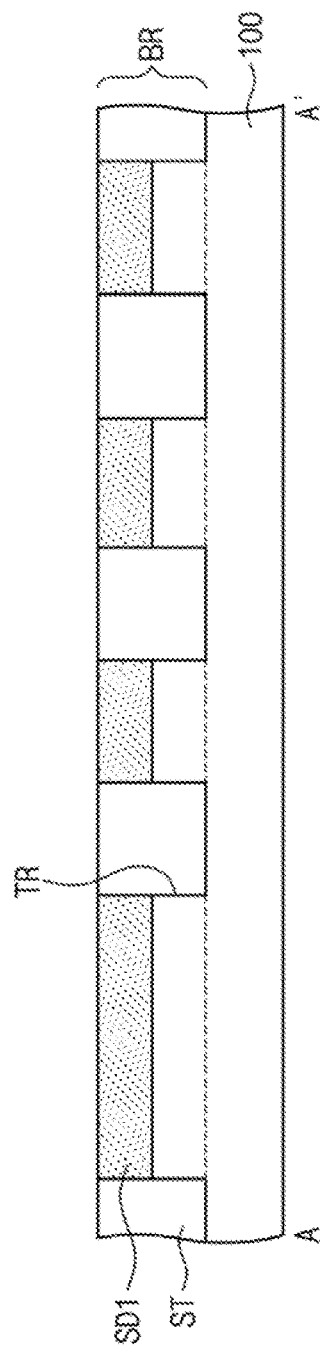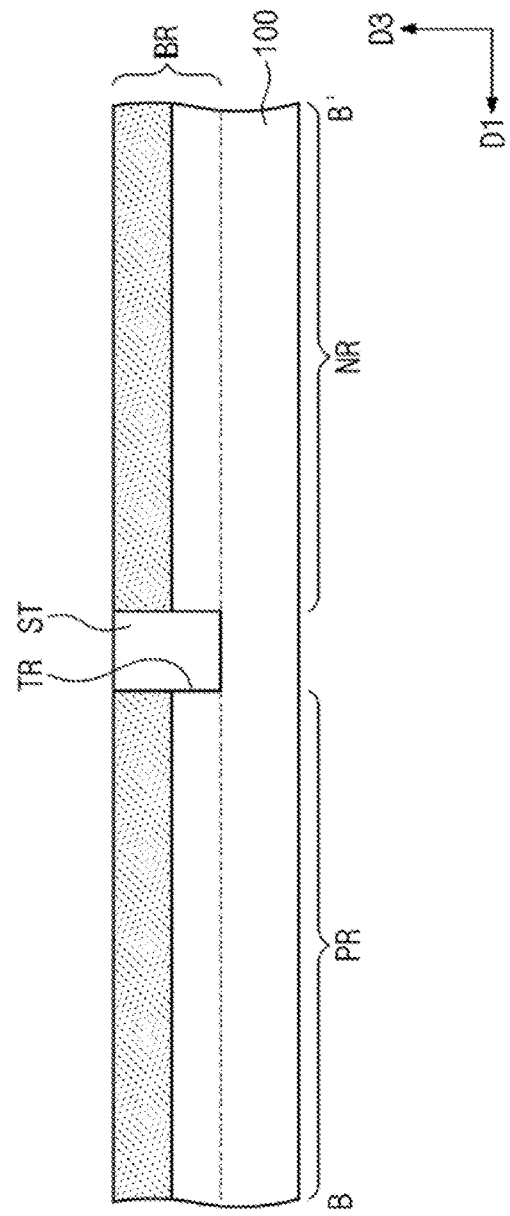

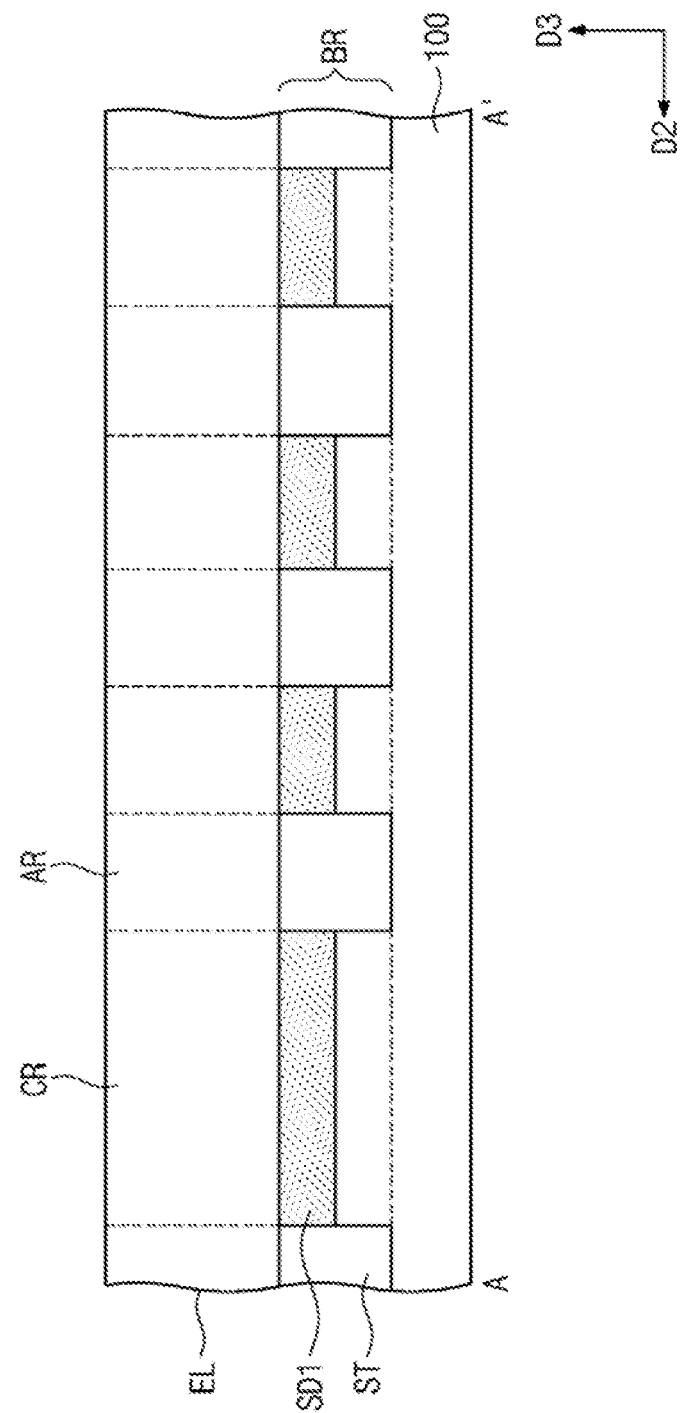

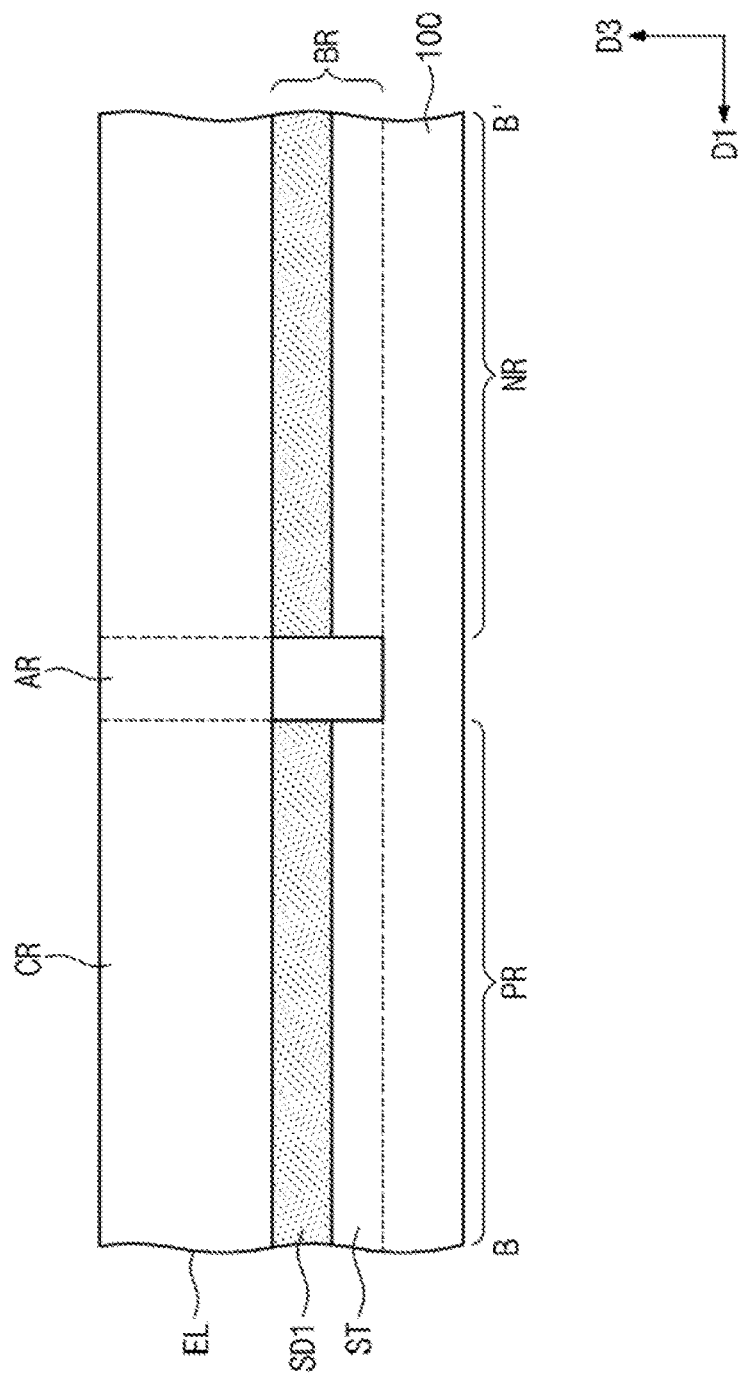

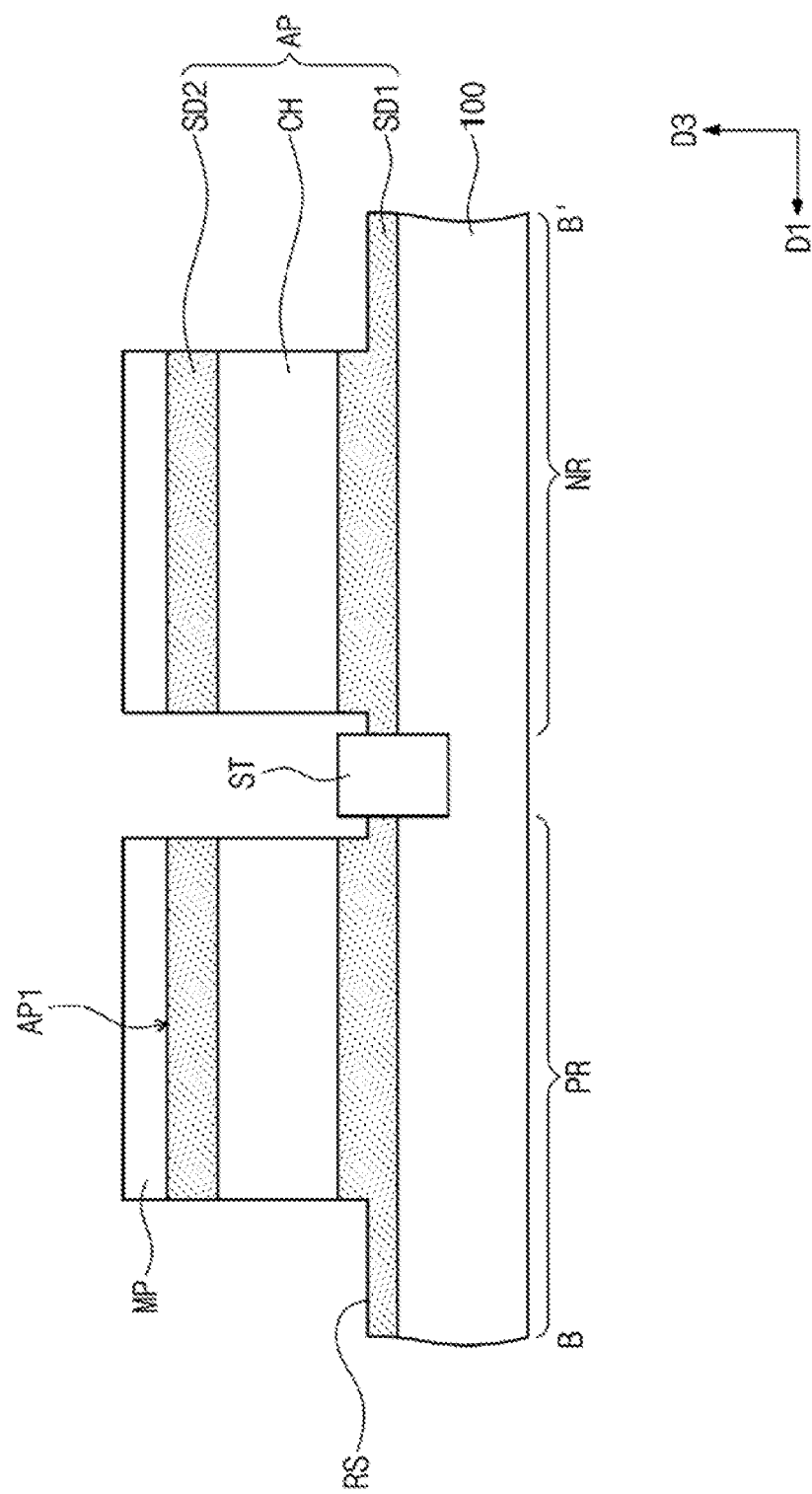

FIG. 15
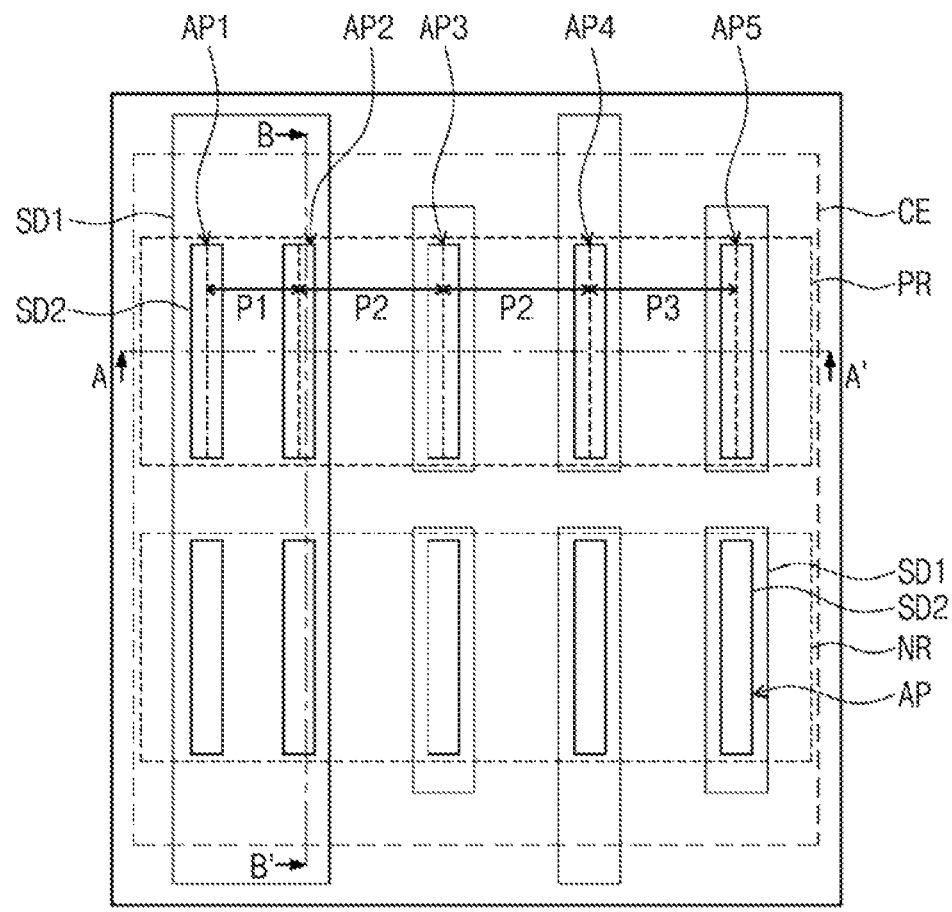
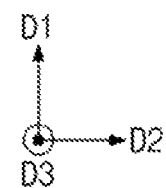

SEMICONDUCTOR DEVICE INCLUDING VERTICAL-TYPE FIELD EFFECT TRANSISTORS AND METHOD OF FABRICATING THE SAME

CROSS-REFERENCE TO RELATED APPLICATIONS

This application claims priority under 35 U.S.C. § 119 to Korean Patent Application No, 10-2016-0160797, filed on Nov. 29, 2016, in the Korean Intellectual Property Office (KIPO), the disclosure of which is incorporated by reference herein in its entirety.

TECHNICAL FIELD

The present disclosure relates to a semiconductor device and a method of fabricating the same, a semiconductor device including vertical-type field effect transistors and a method of fabricating the same.

DISCUSSION OF RELATED ART

Due to their small-sized, multifunctional, and/or low-cost characteristics, semiconductor devices are being considered to be as important elements in the electronic industry. The semiconductor devices may be classified into a memory device for storing data, a logic device for processing data, and a hybrid device including both the memory device and logic device. To meet the increasing demands for the electronic devices with high speed and/or low power consumption, it is necessary to realize semiconductor devices with increased reliability, increased performance, and/or multiple functions. To satisfy these technical requirements, complexity and/or integration density of semiconductor devices are being increased.

SUMMARY

According to an exemplary embodiment of the present inventive concept, a semiconductor device includes a substrate with an upper surface and a lower surface, first to third active patterns extending from the upper surface of the substrate in a direction perpendicular to the upper surface of the substrate. The first to third active patterns are arranged adjacent to each other at a predetermined gap in a first direction. The second active pattern is disposed between the first and third active patterns. The semiconductor device further includes a first gate electrode surrounding side surfaces of the first and second active patterns, and a second gate electrode surrounding side surfaces of the third active pattern. Each of the first to third active patterns includes a first impurity region, a channel region, and a second impurity region that are stacked in a direction perpendicular to the upper surface of the substrate. A distance between the first and second active patterns is a first distance, and a distance between the second and third active patterns is a second distance that is greater than the first distance.

According to an exemplary embodiment of the present inventive concept, a semiconductor device includes first, second, third, and fourth active patterns on a substrate. The semiconductor device also includes a first gate electrode which surrounds side surfaces of the first and second active patterns, a second gate electrode which surrounds side surfaces of the third active pattern, and a third gate electrode which surrounds side surfaces of the fourth active pattern. The first, second, third, and fourth active patterns are adjacent to each other in a first direction. Each of the first to fourth active patterns includes each of first to fourth upper impurity regions and each of first to fourth lower impurity regions, respectively. Each of the first to fourth upper impurity regions, respectively, protrude in a direction perpendicular to the substrate above the first to third gate electrodes. A distance between the first and second active patterns is a first distance, and a distance between the third and fourth active patterns is a second distance that is greater larger than the first distance.

According to an exemplary embodiment of the present inventive concept, a method of fabricating a semiconductor device includes forming a device isolation layer in an upper portion of a substrate to define base regions. The method also includes doping the base regions with impurities to form first impurity regions, and forming a semiconductor layer on a substantially entire upper surface of the substrate. The method further includes doping upper portions of the semiconductor layer with impurities to form second impurity regions, and patterning the semiconductor layer to form first to third active patterns on the base regions. The method also includes forming a first gate electrode to surround side surfaces of the first and second active patterns, and forming a second gate electrode to surround side surfaces of the third active pattern. A distance between the first and second active patterns is a first distance, and a distance between the second and third active patterns is a second distance that is greater than the first distance.

BRIEF DESCRIPTION OF THE DRAWINGS

Various exemplary embodiments of the present inventive concept will be described more fully hereafter with reference to the accompanying drawings, in which some exemplary embodiments are shown. The present inventive concept may, however, be embodied in many different forms and should not be construed as limited to the exemplary embodiments set forth herein.

FIGS. 8A and 8B are sectional views taken along lines A-A' and B-B', respectively, of FIG. 7, according to one or more exemplary embodiments of the present inventive concept;

FIGS. 9, 11, 13, and 15 are plan views illustrating a method of fabricating a semiconductor device, according to one or more exemplary embodiments of the present inventive concept;

FIGS. 10A, 12A, 14A, and 16A are sectional views corresponding to lines A-A' of FIGS. 9, 11, 13 and 15, respectively, according to one or more exemplary embodiments of the present inventive concept;

FIGS. 10B, 12B, 14B, and 16B are sectional views corresponding to lines B-B' of FIGS. 9, 11, 13 and 15, respectively, according to one or more exemplary embodiments of the present inventive concept;

DETAILED DESCRIPTION

Various exemplary embodiments of the present inventive concept will be described more fully hereinafter with reference to the accompanying drawings, in which example embodiments are shown. The present inventive concept may, however, be embodied in many different forms and should not be construed as limited to the exemplary embodiment set forth herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Figure 1:
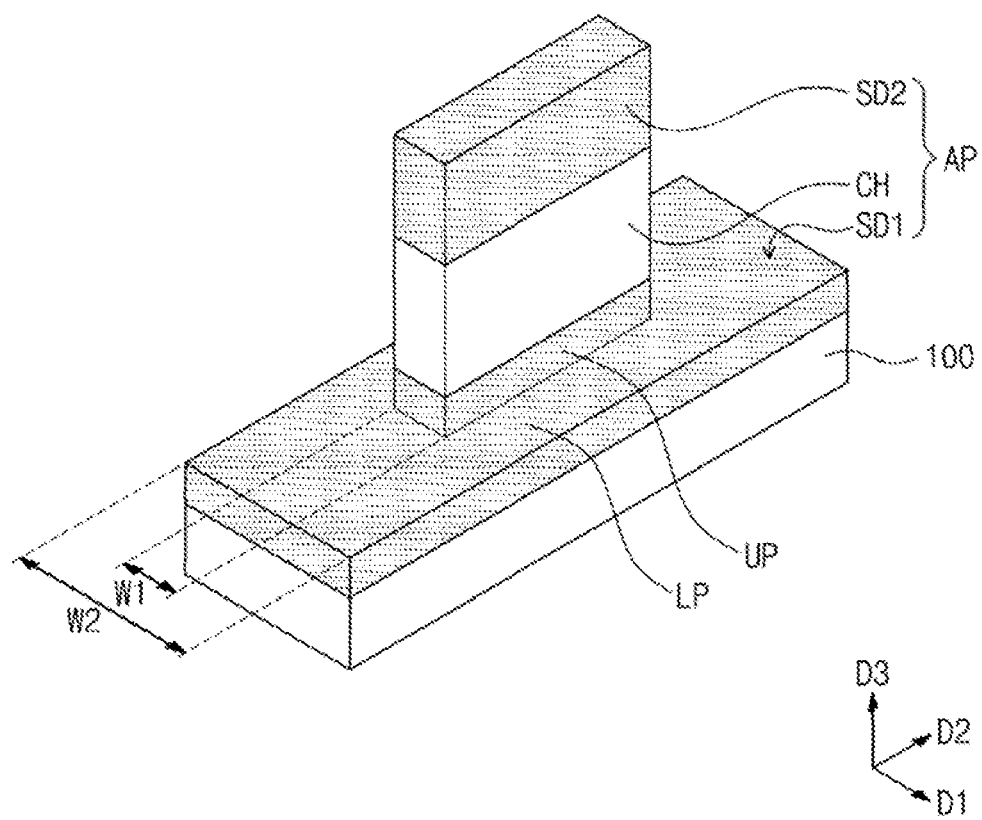
FIGS. 1 and 2 are perspective views illustrating a semiconductor device according to one or more exemplary embodiments of the present inventive concept.
Figure 2:
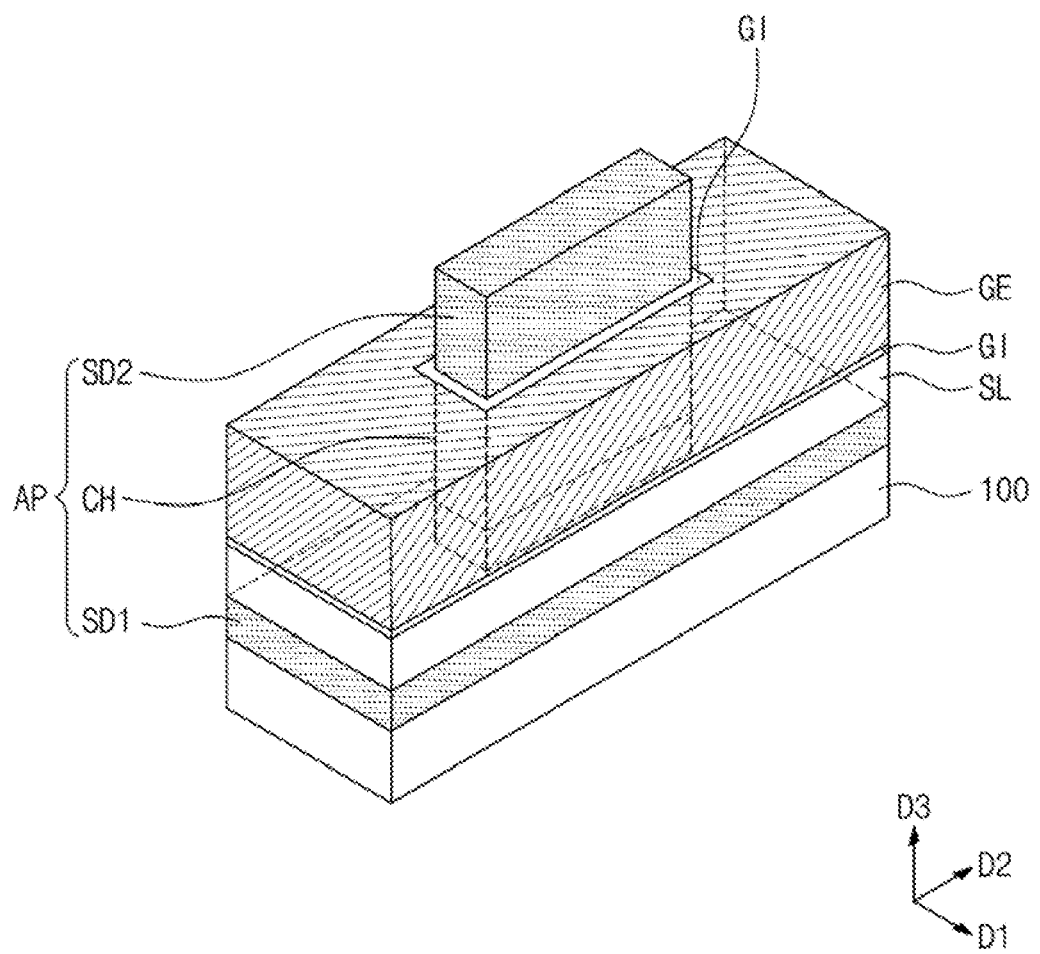

FIGS. 1 and 2 are perspective views illustrating a semiconductor device according to one or more exemplary embodiments of the present inventive concept.

Referring to FIGS. 1 and 2, an active pattern AP may be provided on a substrate 100. The substrate 100 may be a semiconductor substrate (for example, of silicon, germanium, or silicon-germanium) or a compound semiconductor substrate. The active pattern AP may be a pillar-shaped structure which protrudes vertically in the third direction D3 from an upper surface of the substrate 100. The active pattern AP may extend in a second direction D2 and may have a bar shape, when viewed in a plan view. For example, the active pattern AP may have a longitudinal direction parallel to the second direction D2. The active pattern AP may include a first impurity region SD1, a channel region CH, and a second impurity region SD2, which may be sequentially stacked on the substrate 100.

The first impurity region SD1 may include an upper portion UP and a lower portion LP. The upper portion UP of the first impurity region SD1 may have a first width W1 when measured in a first direction D1 that is perpendicular to the second direction D2. The lower portion LP of the first impurity region SD1 may have a second width W2 when measured in the first direction D1. The second width W2 may be greater than the first width W1. As an example, the first impurity region SD1 may be a part of the substrate 100. For example, the first impurity region SD1 may be formed by doping an upper portion of the substrate 100 with impurities. In some embodiments, the first impurity region SD1 may be a region of the substrate 100 that may be doped with n- or p-type impurities.

The channel region CH may be provided on the upper portion UP of the first impurity region SD1. When viewed in a plan view, the channel region CH may have substantially the same shape as that of the upper portion UP of the first impurity region SD1. For example, the channel region CH may have the first width W1 in the first direction D1. In some embodiments, the channel region CH may be a semiconductor pillar which is grown using the first impurity region SD1 as a seed layer. In some embodiments, the channel region CH may be formed of or include a semiconductor material that is the same as that of the substrate 100. On the while, in other embodiments, the channel region CH and the substrate 100 may be formed of different semiconductor materials. For example, the channel region CH may be formed of or include an un-doped silicon layer.

The second impurity region SD2 may be provided on the channel region CH. In some embodiments, the second impurity region SD2 may be formed by doping an upper portion of the semiconductor pillar (for example, the channel region CH) with impurities. When viewed in a plan view, the second impurity region SD2 may have substantially the same shape as that of the channel region CH. The second impurity region SD2 may be formed of or include a semiconductor material that is the same as that of the channel region CH. In some embodiments, the second impurity region SD2 may be formed of or include a silicon layer doped with n- or p-type impurities.

As shown in FIG. 2, a spacer layer SL may be provided to cover the lower portion LP of the first impurity region SD1. The spacer layer SL may cover side surfaces of the upper portion UP of the first impurity region SD1. The spacer layer SL may be provided in such a way that an upper surface thereof may be located at a level equal to or higher than that of the upper portion UP of the first impurity region SD1. Further, the level of the upper surface of the spacer layer SL may be equal to or higher than a level of a lower surface of the channel region CH. The spacer layer SL may include an insulating material, and may include, for example, a silicon oxide layer, a silicon nitride layer, or a silicon oxynitride layer.

A gate electrode GE may be provided on the spacer layer SL. The gate electrode GE may be provided to surround side surfaces of the channel region CH. The gate electrode GE may be spaced apart from the first impurity region. SD1 by the spacer layer SL. The second impurity region SD2 may have a structure protruding above the gate electrode GE provided around the channel region. The gate electrode GE may be provided in such a way that the upper surface of the gate electrode GE may be located at a level equal to or lower than that of the lower surface of the second impurity region SD2. As an example, the gate electrode GE may be formed of or include at least one of conductive metal nitrides (for example, titanium nitride (TiN) or tantalum nitride (TaN)) or metals (for example, titanium (Ti), tantalum (Ta), tungsten (W), copper (Cu), or aluminum (Al)).

A gate dielectric pattern GI may be interposed between the gate electrode GE and the channel region CH. The gate dielectric pattern GI may also be interposed between the gate electrode GE and the spacer layer SL. The gate dielectric pattern GI may cover a lower surface and inner side surfaces of the gate electrode GE. An upper surface of the gate dielectric pattern GI may be coplanar with the upper surface of the gate electrode GE. The gate dielectric pattern GI may be formed of or include a silicon oxide layer, a silicon oxynitride layer, or a high-k dielectric layer. For example, the gate dielectric pattern GI may be formed of or include at least one of hafnium oxide ($HfO_2$), hafnium silicon oxide ($HfSiO_4$), lanthanum oxide ($HfO_2$), zirconium oxide ($ZrO_2$), zirconium silicon oxide ($ZrSiO_4$), tantalum oxide ($Ta_2O_5$), titanium oxide ($TiO_2$), barium strontium titanium oxide (BST), barium titanium oxide ($BaTiO_3$), strontium titanium oxide ($SrTiO_3$), lithium oxide ($Li_2O$), aluminum oxide (Al$_2$O$_3$), lead scandium tantalum oxide (PST), or lead zinc niobate (PZN).

The semiconductor device shown in FIGS. 1 and 2 may be a vertical-type transistor, in which carriers are allowed to flow in a vertical direction (hereinafter, in the third direction D3). For example, in the case where a transistor is turned on by a voltage applied to the gate electrode GE, carriers may flow from the first impurity region SD1 (or a source region) to the second impurity region SD2 (or a drain region) through the channel region CH. In some embodiments, the gate electrode GE of the semiconductor device may be provided to substantially entirely surround four side surfaces of the channel region CH. For example, the semiconductor device, according to one or more exemplary embodiments of the present inventive concept, may be a gate-all-around transistor. According to one or more exemplary embodiments of the present inventive concept, it may be possible to provide a semiconductor device with excellent electric characteristics.

Figure 3:
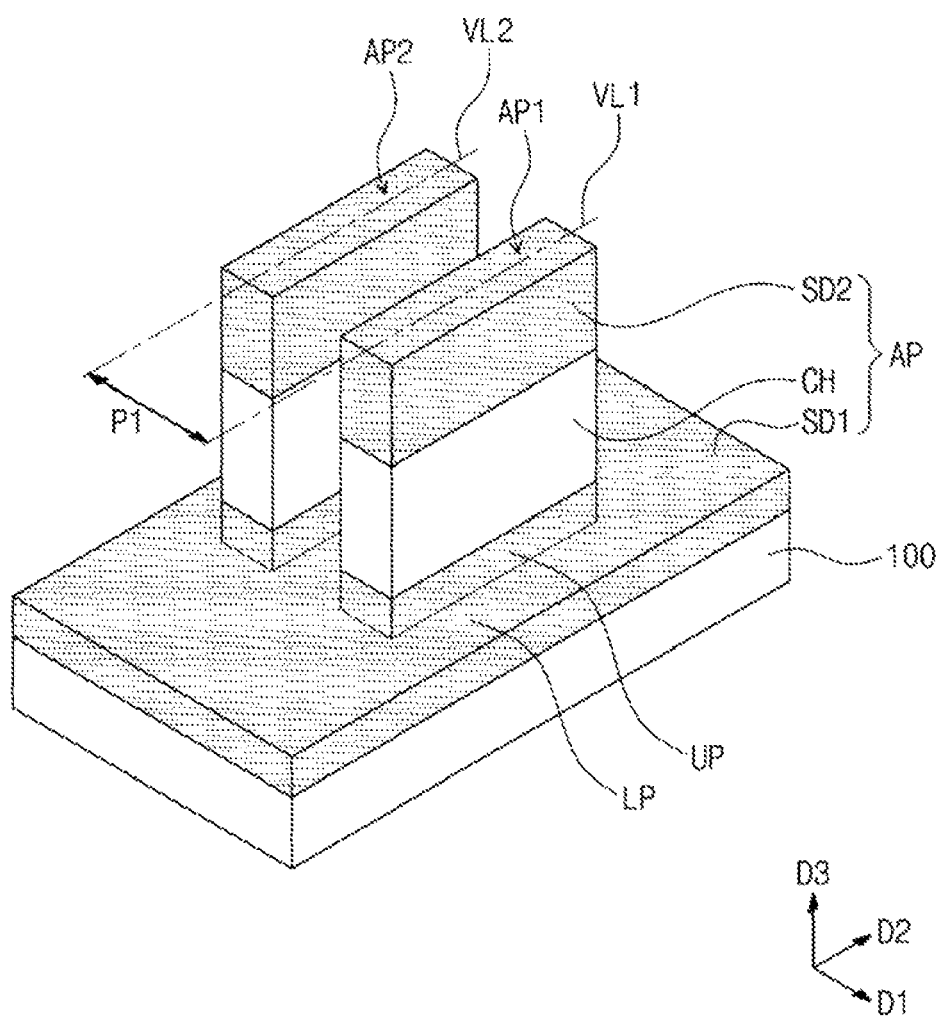
FIGS. 3 and 4 are perspective views illustrating a semiconductor device according to one or more exemplary embodiments of the present inventive concept.
Figure 4:
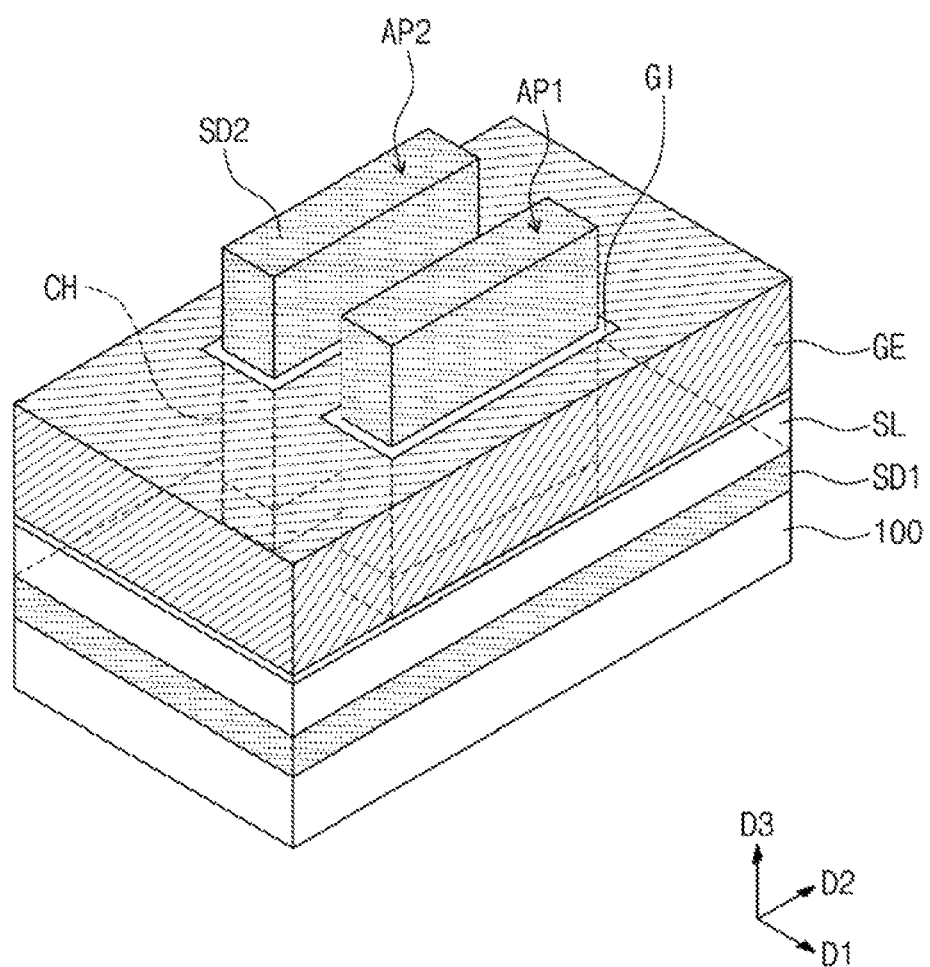

FIGS. 3 and 4 are perspective views illustrating a semiconductor device according to one or more exemplary embodiments of the present inventive concept. For concise description, an element previously described with reference to FIGS. 1 and 2 may be designated by a similar or identical reference numeral without repeating an overlapping description thereof.

Referring to FIGS. 3 and 4, a first active pattern AP1 and a second active pattern AP2 may be provided on the substrate 100. The first and second active patterns AP1 and AP2 may be arranged to be adjacent to each other at a predetermined distance in the first direction D1. The first and second active patterns AP1 and AP2 may be parallel to each other in the second direction D2. Each of the first and second active patterns AP1 and AP2 may be provided to have substantially the same shape as the active pattern AP previously described with reference to FIGS. 1 and 2.

The first and second active patterns AP1 and AP2 may be provided to share one of a plurality of first impurity regions SD1. For example, each of the first impurity regions SD1 may be used as a common source or a common drain of the first and second active patterns AP1 and AP2. For example, the first impurity region SD1 may include the lower portion LP and two upper portions UP on the lower portion LP. A semiconductor pillar with the channel region CH and the second impurity region SD2 may be provided on each of the upper portions UP.

Hereinafter, virtual lines passing through centers of the first and second active patterns AP1 and AP2 will be referred to as first and second virtual lines VL1 and VL2, respectively. The first virtual line VL1 may be selected to be parallel to the second direction D2 or the longitudinal direction of the first active pattern AP1, and the second virtual line VL2 may be selected to be parallel to the second direction D2 or the longitudinal direction of the second active pattern AP2. A distance between the first and second virtual lines VL1 and VL2 in the first direction D1 may be a center-to-center distance between the first and second active patterns AP1 and AP2. Hereinafter, a distance between the active patterns AP may refer to a center-to-center distance between the active patterns AP. For example, the distance between the active patterns AP may be a distance between virtual lines passing through centers thereof. A distance between the first and second active patterns AP1 and AP2 may be referred to as a first distance P1.

As shown in FIG. 4, the gate electrode GE may be provided on the spacer layer S1, covering the first impurity region SD1. The gate electrode GE may be provided to surround the channel regions CH of the first and second active patterns AP1 and AP2. Each of the second impurity regions SD2 of the first and second active patterns AP1 and AP2 may have a structure protruding above the gate electrode GE.

The semiconductor device shown in FIGS. 3 and 4 may be used as a single vertical-type transistor. The vertical-type transistor of FIGS. 3 and 4 may be configured to have a plurality of channel regions CH due to the increased area of the gate electrode GE that may surround the channel regions CH of the first and second active patterns AP1 and AP2, respectively. Thus, due to the increased area of the gate electrode GE, the vertical-type transistor of FIGS. 3 and 4 may have higher carrier mobility, when compared with the carrier mobility of the vertical-type transistor of FIGS. 1 and 2.

Figure 5:
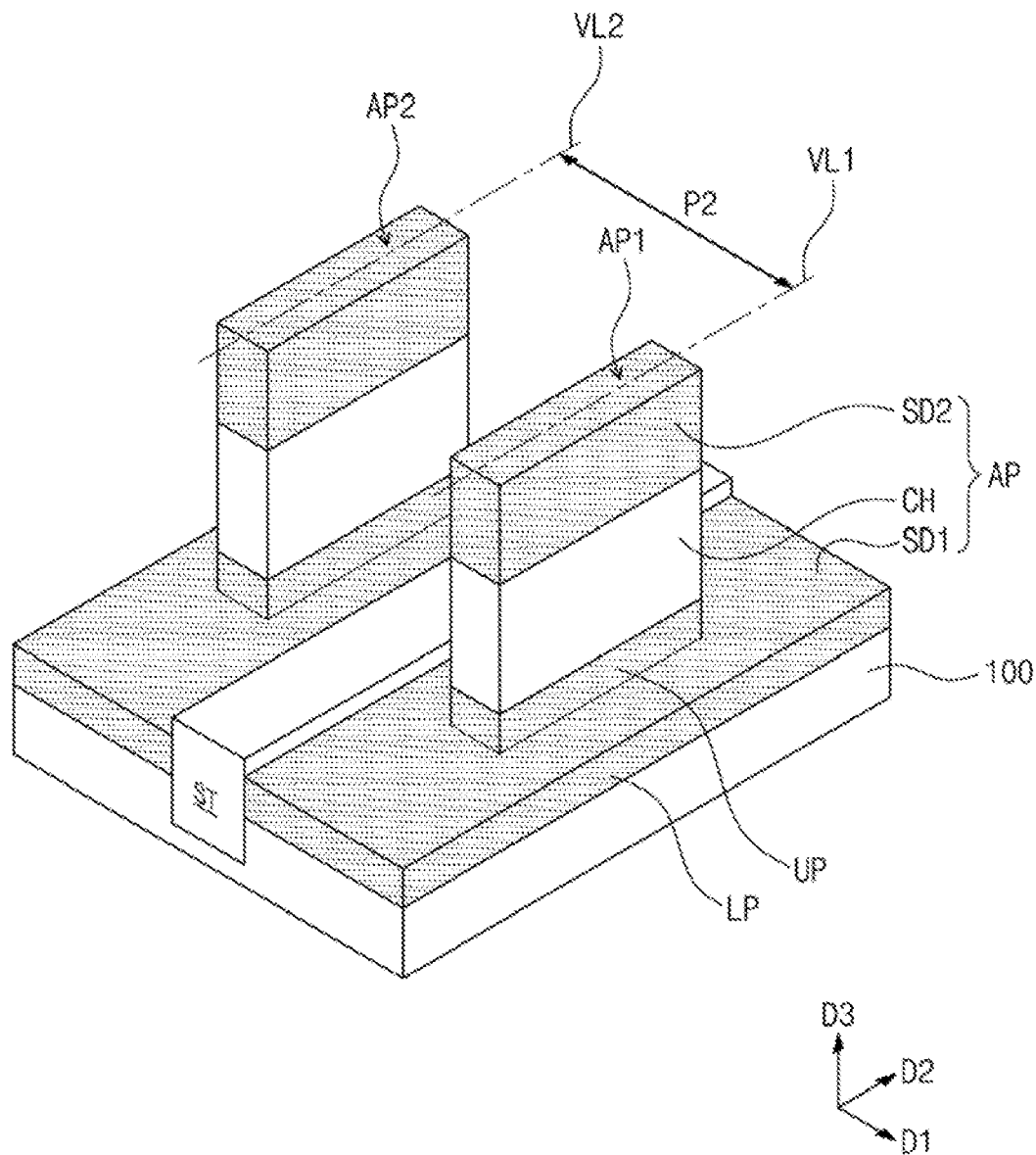
FIGS. 5 and 6 are perspective views illustrating a semiconductor device according to one or more exemplary embodiments of the present inventive concept.
Figure 6:
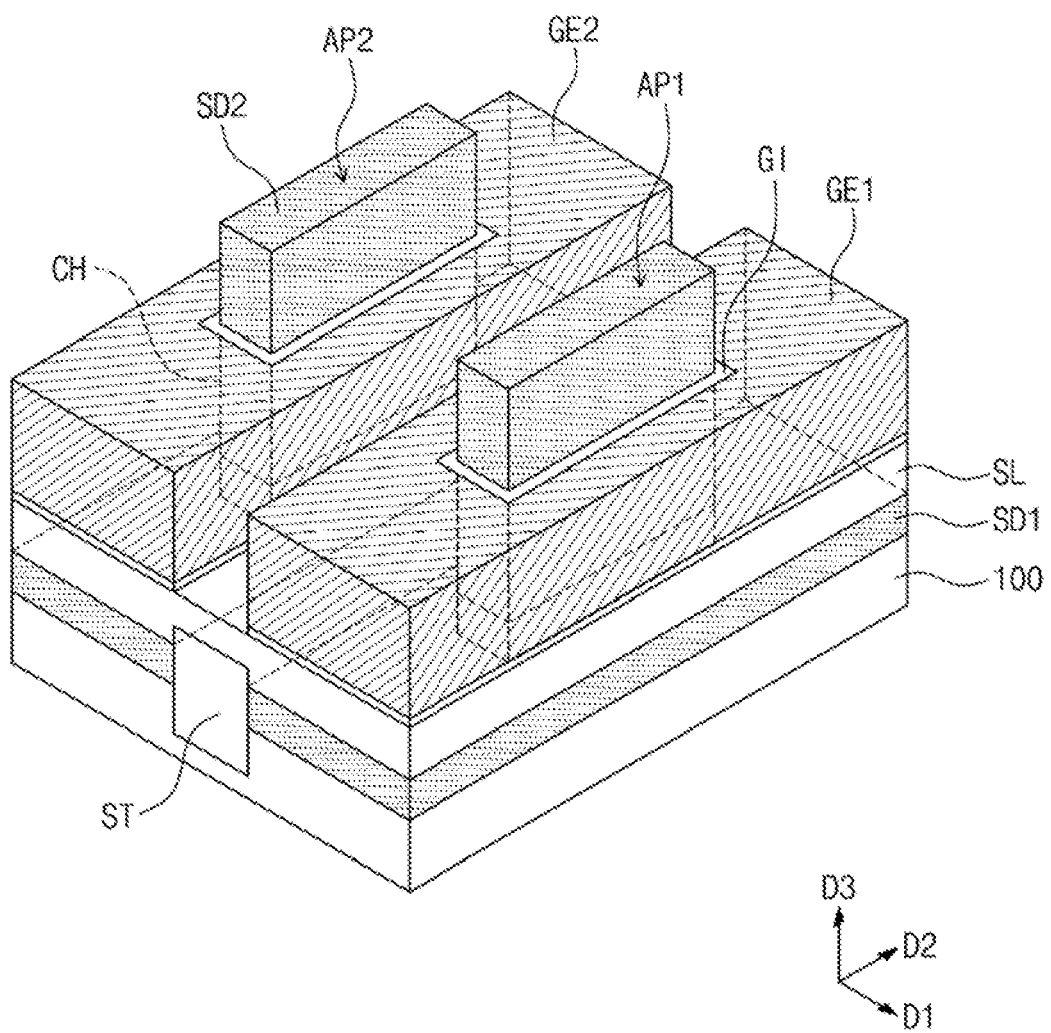

FIGS. 5 and 6 are perspective views illustrating a semiconductor device according to one or more exemplary embodiments of the present inventive concept. For concise description, an element previously described with reference to FIGS. 1 and 2 may be designated by a similar or identical reference numeral without repeating an overlapping description thereof.

Referring to FIGS. 5 and 6, the first active pattern AP1 and the second active pattern AP2 may be provided on the substrate 100. The first and second active patterns AP1 and AP2 may be arranged to be adjacent to each other at a predetermined distance in the first direction D1. The first and second active patterns AP1 and AP2 may be parallel to each other in the second direction D2. Each of the first and second active patterns AP1 and AP2 may be provided to have substantially the same shape as the active pattern AP previously described with reference to FIGS. 1 and 2.

A device isolation layer ST may be provided between the first impurity region SD1 for the first active pattern AP1 and the first impurity region SD1 for the second active pattern AP2. The first impurity region SD1 for the first active pattern AP1 may be electrically disconnected from the first impurity region SD1 for the second active pattern AP2. The device isolation layer ST may be provided to have an upper surface located at a level higher than that of an upper surface of the lower portion LP of the first impurity region SD1. A level of a lower surface of the device isolation layer ST may be lower than that of a lower surface of the first impurity region SD1. The device isolation layer ST may be formed of or include, for example, a silicon oxide layer.

A distance between the first and second virtual lines VL1 and VL2 in the first direction D1 may be a center-to-center distance between the first and second active patterns AP1 and AP2. The distance between the first and second active patterns AP1 and AP2 may be a second distance P2. The second distance P2 between the first and second active patterns AP1 and AP2 may be greater than the first distance P1 between the first and second active patterns AP1 and AP2 described with reference to FIGS. 3 and 4.

The spacer layer SL may be provided to cover the first impurity regions SD1 and the device isolation layer ST. A first gate electrode GE1 and a second gate electrode GE2 may be provided on the spacer layer SL. The first gate electrode GE1 may be provided to surround the channel region CH of the first active pattern AP1, and the second gate electrode GE2 may be provided to surround the channel region CH of the second active pattern AP2. The first and second gate electrodes GE1 and GE2 may be spaced apart from each other in the first direction D1. The second impurity regions SD2 of the first and second active patterns AP1 and AP2 may protrude above the first and second gate electrodes GE1 and GE2 in the vertical direction.

In a semiconductor device according to one or more exemplary embodiments of the present inventive concept, a distance between an adjacent pair of the active patterns may vary from region to region. In the semiconductor device of the present embodiment, the second distance P2 between the first and second active patterns AP1 and AP2 may be relatively large enough, at least, in part, due to the presence of the device isolation layer ST, to secure a sufficient distance between the first and second gate electrodes GE1 and GE2. In an embodiment of the semiconductor device described with reference to FIGS. 3 and 4, a single gate electrode GE may be provided to surround the first and second active patterns AP1 and AP2 without any mechanical elements disposed between the first and second active patterns AP1 and AP2. Therefore, the first distance P1 between the first and second active patterns AP1 and AP2 may be relatively small. For example, in the semiconductor device according to one or more embodiments of the present inventive concept, by adaptively adjusting distances between the active patterns, the area occupied by the active patterns or a cell area may be reduced.

Figure 7:
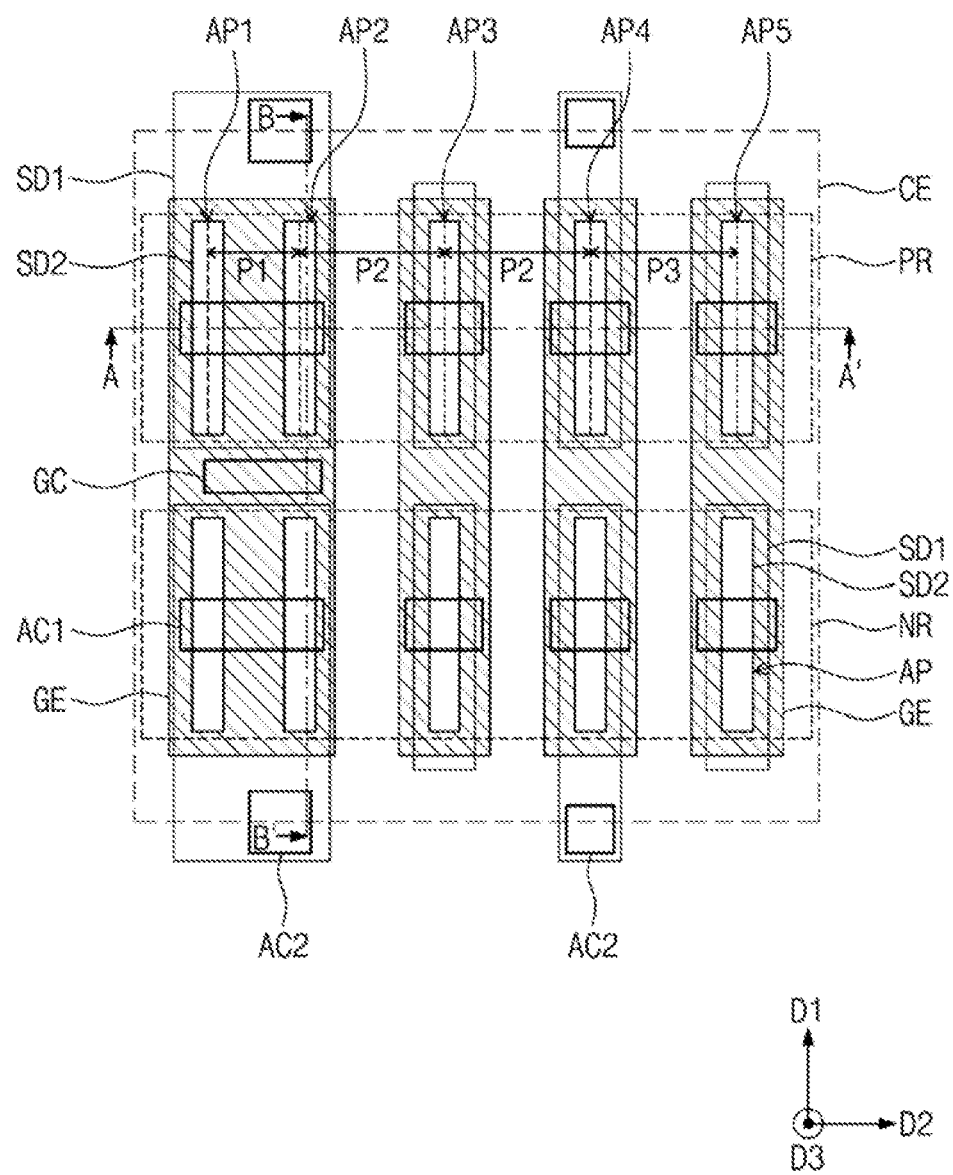
FIG. 7 is a plan view illustrating a semiconductor device according to an exemplary embodiment of the present inventive concept.
Figure 8A:
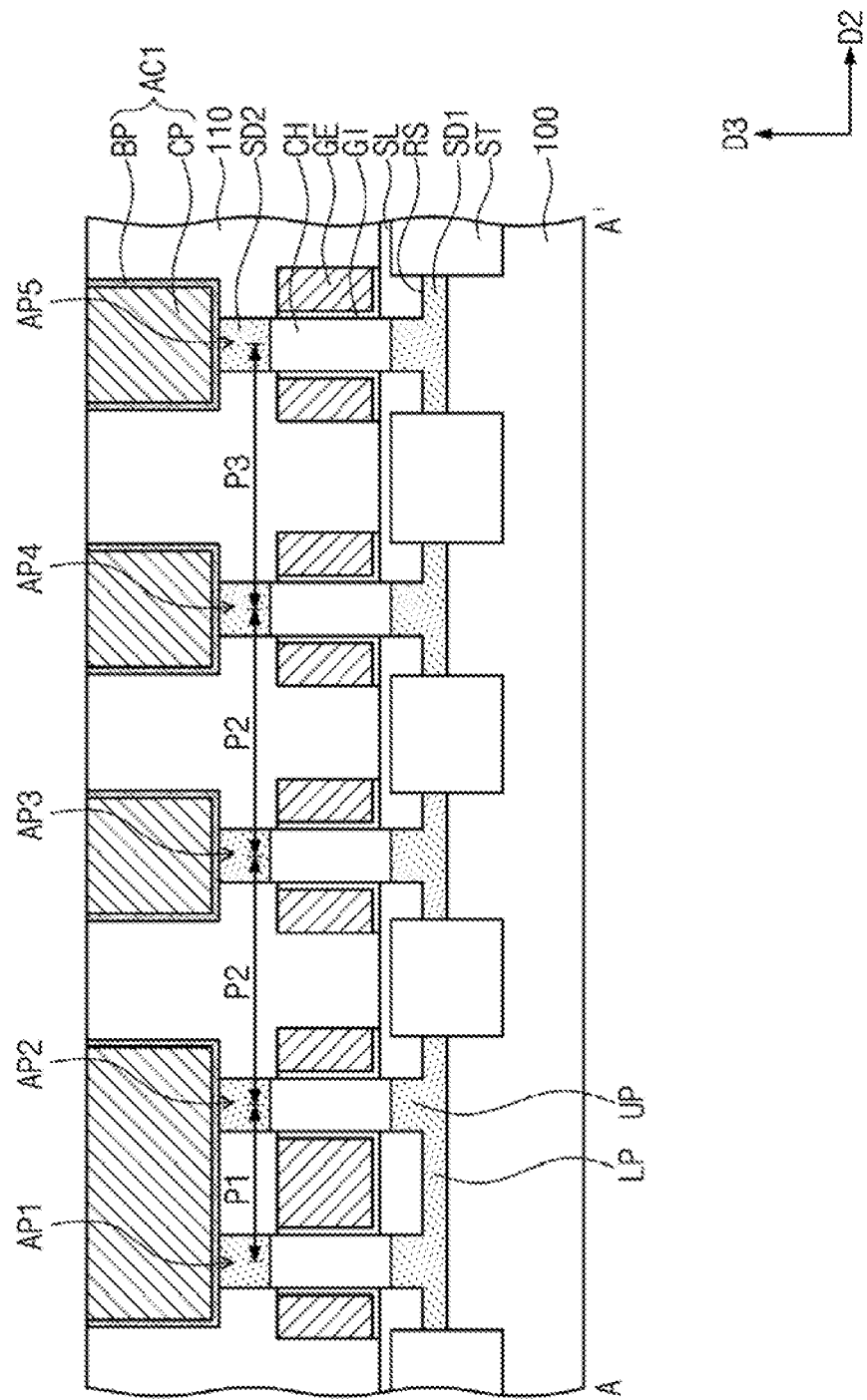

FIG. 7 is a plan view illustrating a semiconductor device according to one exemplary embodiments of the present inventive concept. FIGS. 8A and 8B are sectional views taken along lines A-A' and B-B', respectively, of FIG. 7, according to one or more exemplary embodiments of the present inventive concept. For concise description, an element previously described with reference to FIGS. 1 to 6 may be designated by a similar or identical reference numeral without repeating an overlapping description thereof.

Referring to FIGS. 7, 8A, and 8B, the substrate 100 may include a cell region CE. The cell region CE may be a region, on which logic transistors for a logic circuit of a semiconductor device may be formed. For example, logic transistors constituting a processor core or I/O terminals may be provided on the cell region CE. The cell region CE may be a part of the processor core or the I/O terminal.

The device isolation layer ST may be provided to define a PMOSFET region PR and an NMOSFET region NR in the substrate 100. The device isolation layer ST may be formed in an upper portion of the substrate 100, as shown in FIG. 8A. When viewed in the first direction D1 which is parallel to the longitudinal direction of the active patterns AP, each of the active patterns AP in the PMOSFET and NMOSFET regions PR and NR, respectively, may be spaced apart from each other with the device isolation layer ST interposed therebetween. The PMOSFET and NMOSFET regions PR and NR may extend in the second direction D2 that is perpendicular to the first direction D1. When viewed from the third direction D3, each of the collective PMOSFET and NMOSFET regions PR and NR may be spaced apart from each other with a gate contact (GC).

A plurality of active patterns AP may be provided on each of the PMOSFET and NMOSFET regions PR and NR. Each of the active patterns AP may be a bar-shaped structure extending in the first direction D1. The active patterns AP on the PMOSFET region PR may be arranged in the second direction D2. The active patterns AP on the NMOSFET region NR may be arranged in the second direction D2. Each of the active patterns AP may include the first impurity region SD1, the channel region CH, and the second impurity region SD2, which may be sequentially stacked on the substrate 100. The first and second impurity regions SD1 and SD2 of the PMOSFET region PR may include p-type impurities, and the first and second impurity regions SD1 and SD2 of the NMOSFET region NR may include n-type impurities. In some embodiments, as shown in FIG. 8A, the active patterns AP may include first to fifth active patterns AP1-AP5, which are provided on the PMOSFET region PR.

The device isolation layer ST may be placed between the adjacent active patterns AP. For example, FIG. 8A shows that the device isolation layer ST may be provided between the second and third active patterns AP2 and AP3, between the third and fourth active patterns AP3 and AP4, and between the fourth and fifth active patterns AP4 and AP5. There may be no device isolation layer between the first and second active patterns AP1 and AP2.

A distance between the first and second active patterns AP1 and AP2 may be a first distance P1, a distance between the second and third active patterns AP2 and AP3 may be a second distance P2, a distance between the third and fourth active patterns AP3 and AP4 may be a second distance P2, and a distance between the fourth and fifth active patterns AP4 and AP5 may be a third distance P3. In one embodiment, the first, second, and third distances P1, P2, and P3 may be different from each other. For example, the second distance P2 may be greater than the first distance P1. The third distance P3 may be greater than the second distance P2.

As also shown in FIG. 8A, each of the first impurity regions SD1 may include a recess RS formed in an upper portion thereof. The recess RS may define the upper portion UP and the lower portion LP of the first impurity region SD1. For example, the upper and lower portions UP and LP of the first impurity region SD1 may be distinguished based on a lower surface of the recess RS. In one example, the upper portion UP may be a portion above the lower surface of the recess RS, while the lower portion LP may be a portion below the lower surface of the recess RS. The spacer layer SL may be provided to fill the recesses RS of the first impurity regions SD1. The spacer layer SL may be provided to cover the upper surface and at least a portion of the side surfaces of the device isolation layer ST.

The first impurity region SD1 of each of the first and second active patterns AP1 and AP2 may include a portion extending in the first direction D1. The first impurity region SD1 for the fourth active pattern AP4 may include a portion extending in the first direction D1. Such an extending portion of the first impurity region SD1 may be coupled to a second active contact AC2 to be described below.

The gate electrodes GE may be provided on the spacer layer SL to enclose the channel regions CH of the active patterns AP. One or each of the gate electrodes GE may be provided to surround the channel regions CH of the first and second active patterns AP1 and AP2. The first and second active patterns AP1 and AP2 and the gate electrode GE surrounding the first and second active patterns AP1 and AP2 may be similar to those of the semiconductor device described with reference to FIGS. 3 and 4. FIG. 8A also shows that each of the gate electrodes GE may cover a corresponding one of the third to fifth active patterns AP3, AP4, and AP5. The gate electrodes GE and the third to fifth active patterns AP3, AP4, and AP5 may be similar to those of the semiconductor device described with reference to FIGS. 5 and 6.

Each of the gate electrodes GE may be a bar- or line-shaped structure extending in the first direction D1. At least one of the gate electrodes GE may be provided to surround not only the active pattern AP on the PMOSFET region PR but also the active pattern AP on the NMOSFET region NR. Although not shown, at least one of the gate electrodes GE may include two portions (for example, first and second electrodes) which are separated from each other and are provided on the PMOSFET and NMOSFET regions PR and NR, respectively. For example, the first electrode of the gate electrode GE may surround active patterns AP on the PMOSFET region PR, and the second electrode of the gate electrode GE may surround active patterns AP on the NMOSFET region NR, respectively.

An interlayered insulating layer 110 may be provided to cover the gate electrodes GE and the active patterns AP. The interlayered insulating layer 110 may be formed of or include, for example, a silicon oxide layer or a silicon oxynitride layer. Each of the second impurity regions SD2 of the active patterns AP may protrude above the gate electrode GE in the third direction D3. As shown in FIG. 8A, first active contacts AC1 may be provided to penetrate the interlayered insulating layer 110 and may be coupled to the second impurity regions SD2. The second impurity regions SD2 of the first and second active patterns AP1 and AP2 may be connected in common to one of the first active contacts AC1. As shown in FIG. 8B, second active contacts AC2 may be provided to pass through the interlayered insulating layer 110 and the spacer layer SL, and may be connected to the first impurity regions SD1. The gate contact GC may be provided to pass through the interlayered insulating layer 110 and may be connected to the gate electrode GE.

Each of the first and second active contacts AC1 and AC2 and the gate contact GC may include a conductive pattern CP and a barrier pattern BP, which may be provided to surround the exterior of the conductive pattern CP. For example, the barrier pattern BP may be provided to cover side surfaces and lower surfaces of the conductive pattern CP. The barrier pattern BP may not cover an upper surface of the conductive pattern CP. The conductive pattern CP may be formed of or include at least one of metals (for example, cobalt (Co), tungsten (W), and copper (Cu)). The barrier pattern BP may be formed of or include at least one of metals or metal nitrides (for example, Ti/TiN).

Although not shown, at least one interconnection layer may be provided on the interlayered insulating layer 110 and may be electrically connected to the first active contacts AC1, the second active contacts AC2, and the gate contact GC. The interconnection layer may include power lines, which are used to transmit a power or ground voltage, and conductive lines, which are used for a routing of logic transistors.

FIGS. 9, 11, 13, and 15 are plan views illustrating a method of fabricating a semiconductor device, according to one or more exemplary embodiments of the present inventive concept. FIGS. 10A, 12A, 14A, and 16A are sectional views corresponding to lines A-A' of FIGS. 9, 11, 13 and 15, respectively, according to one or more exemplary embodiments of the present inventive concept, and FIGS. 10B, 12B, 14B, and 16B are sectional views corresponding to lines B-B' of FIGS. 9, 11, 13 and 15, respectively, accordingly to one or more exemplary embodiments of the present inventive concept.

Figure 9:
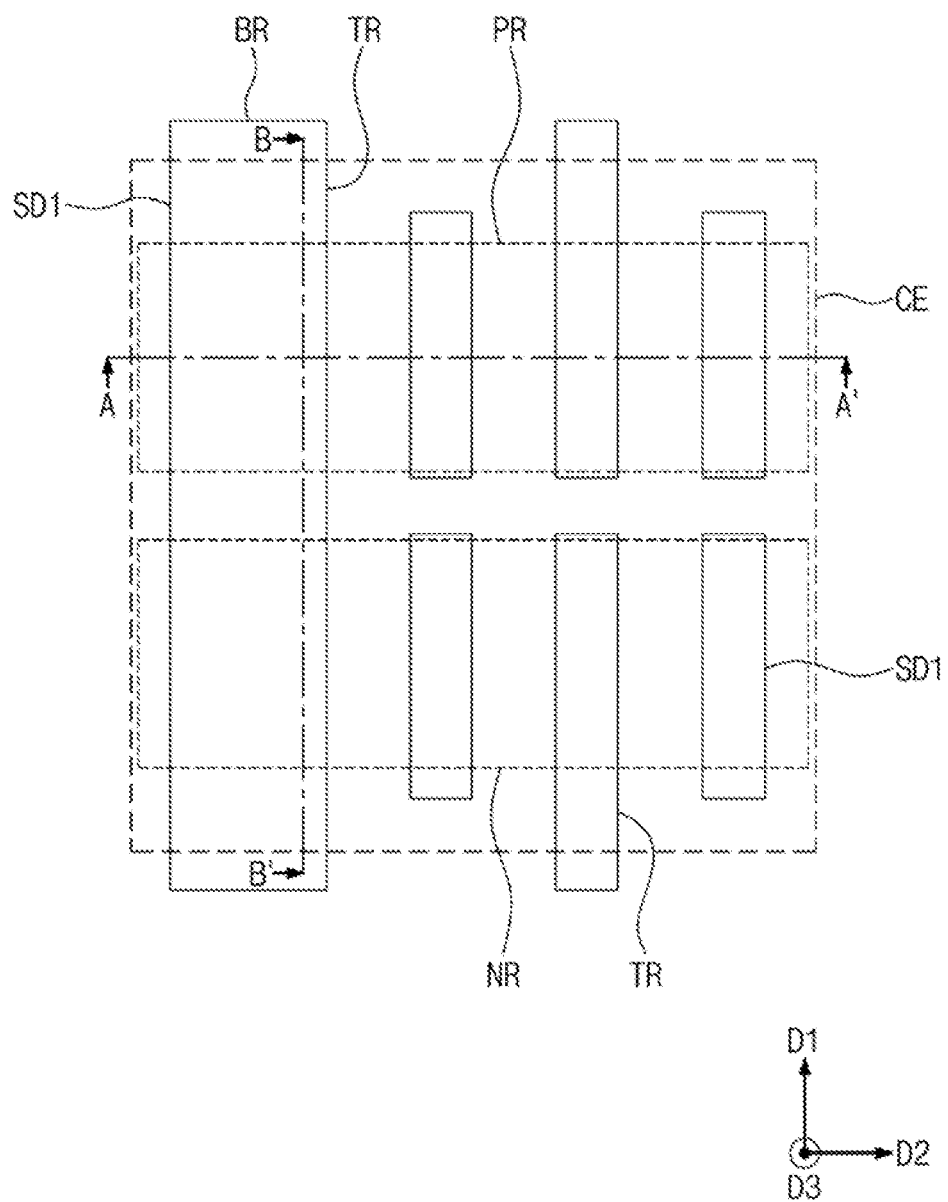

Referring to FIGS. 9, 10A, and 10B, the substrate 100 with the cell region CE may be provided. As an example, the substrate 100 may be a semiconductor substrate, for example, made of silicon, germanium, or silicon-germanium, or a compound semiconductor substrate. An upper portion of the substrate 100 may be patterned to form trenches TR. The trenches TR may define base regions BR at an upper portion of the substrate 100. The base regions BR may be located on the PMOSFET and NMOSFET regions PR and NR of the substrate 100.

The device isolation layer ST may be formed to fill the trenches TR. The formation of the device isolation layer ST may include forming an insulating layer on the substrate 100 to fill the trenches TR and planarizing the insulating layer to expose upper surfaces of the base regions BR. The device isolation layer ST may be formed of or include, for example, a silicon oxide layer.

Upper portions of the base regions BR may be doped with impurities, and as a result, the first impurity regions SD1 may be formed in the upper portions of the base regions BR. In some embodiments, the upper portions of the base regions BR of the PMOSFET region PR may be selectively doped with p-type impurities, and the upper portions of the base regions BR of the NMOSFET region NR may be selectively doped with n-type impurities. The first impurity regions SD1 may be formed in such a way that lower surfaces thereof may be located at a level higher than the lower surface of the device isolation layer ST.

Figure 11:
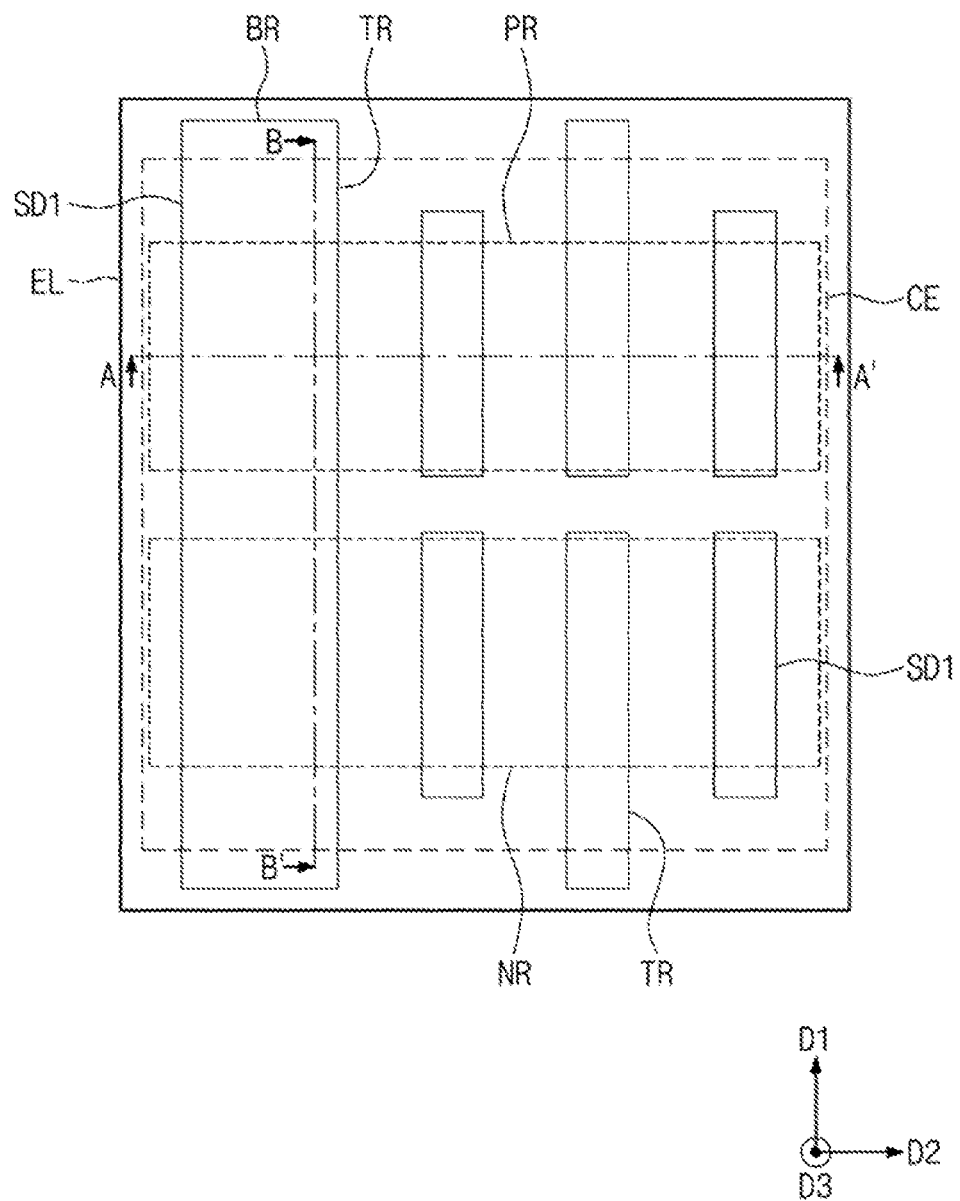

Referring to FIGS. 11, 12A, and 12B, an epitaxial growth process may be performed to form a semiconductor layer EL on the substantially entire upper surface of the substrate 100. A semiconductor material, which is the same as or different from the substrate 100, may be used in the epitaxial growth process for forming the semiconductor layer EL. For example, silicon may be used in the epitaxial growth process, and thus, the semiconductor layer EL may be a silicon layer.

The semiconductor layer EL may include crystalline regions CR on the first impurity regions SD1 and an amorphous region AR on the device isolation layer ST. The crystalline regions CR of the semiconductor layer EL may be grown using the first impurity regions SD1 as a seed layer, and thus, the crystalline regions CR may have the same crystal structure as that of the first impurity regions SD1. Also, the amorphous region AR of the semiconductor layer EL may be grown using the device isolation layer ST as a seed layer, and thus, the amorphous region AR may have an amorphous structure based on the device isolation layer ST having the amorphous structure.

Figure 13:
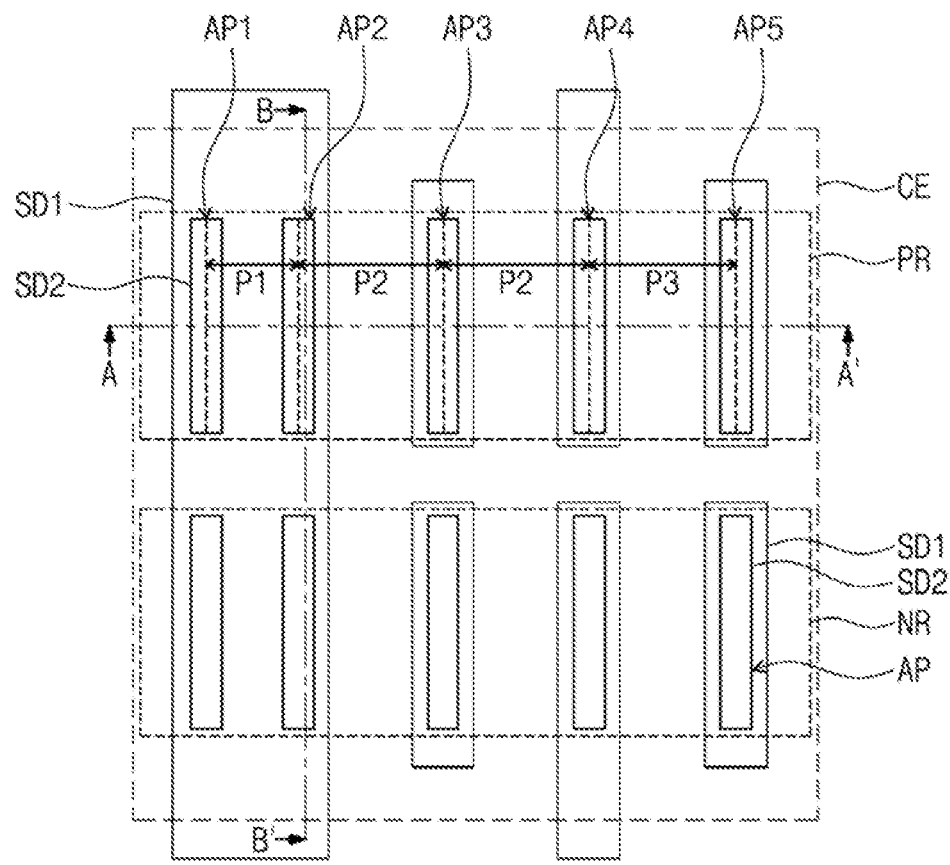
Figure 14A:
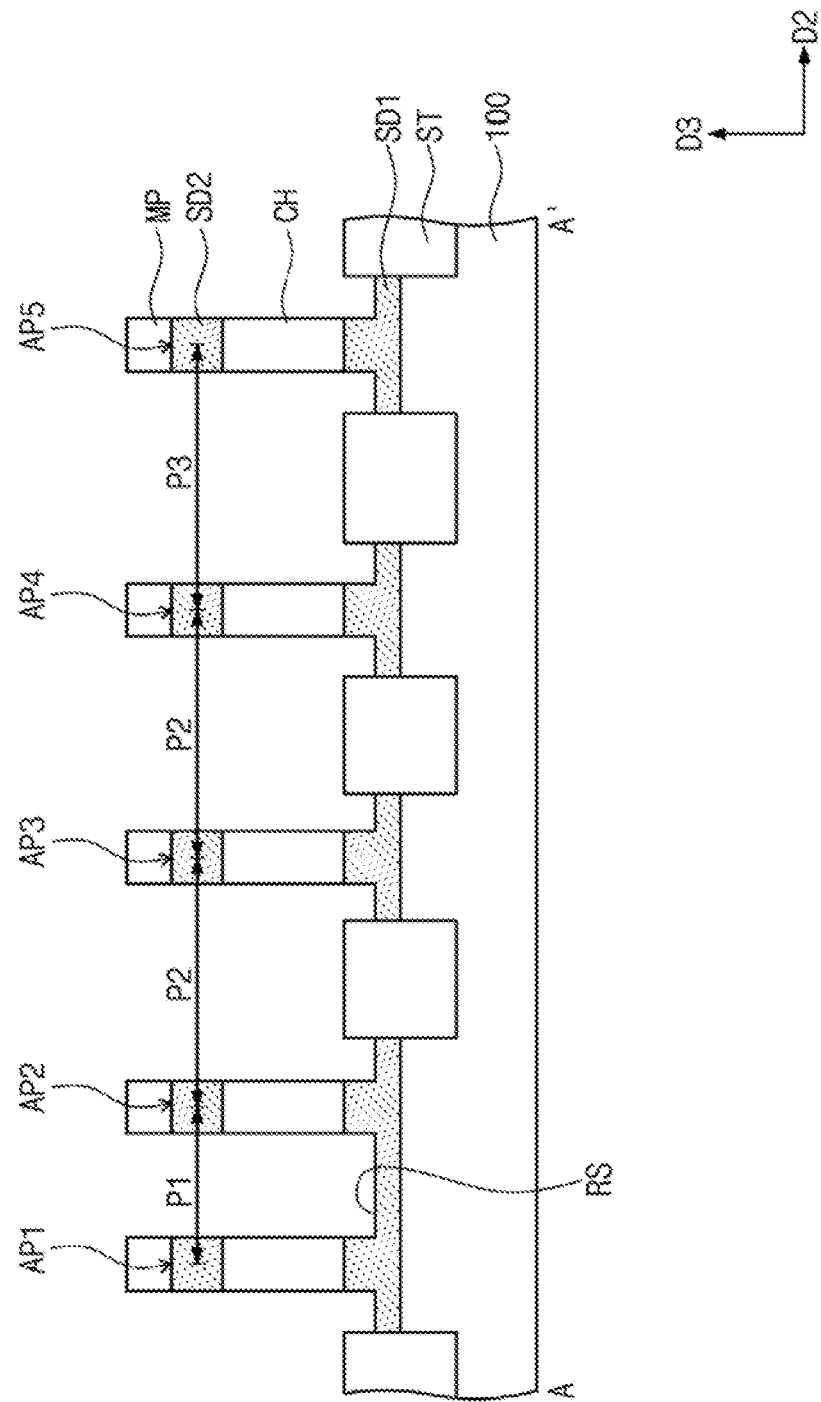

Referring to FIGS. 13, 14A, and 14B, upper portions of the crystalline regions CR of the semiconductor layer EL may be doped with impurities, and thus, second impurity regions SD2 with a predetermined thickness may be formed in the upper portions of the crystalline regions CR. In some embodiments, the crystalline regions CR of the PMOSFET region PR may be selectively doped with p-type impurities, and the crystalline regions CR of the NMOSFET region NR may be selectively doped with n-type impurities.

The semiconductor layer EL may be patterned to form the active patterns AP. The formation of the active patterns AP may include forming mask patterns MP on an upper portion of the semiconductor layer EL and then etching the semiconductor layer EL using the mask patterns MP as an etch mask. The mask patterns MP may be formed by a sidewall image transfer (SIT) process. For example, the formation of the mask patterns MP may include forming sacrificial patterns on the semiconductor layer EL, forming spacers on both side surfaces of each of the sacrificial patterns, and removing the sacrificial patterns. In this case, the remaining spacers may be used as the mask patterns MP.

During the etching process of the semiconductor layer EL, portions of the first impurity regions SD1 may be exposed to and etched by an etchant, and thus, the recesses RS may be formed in the first impurity regions SD1. The etched portions of the first impurity regions SD1 may have etched surfaces which are perpendicular to the direction D3.

In one example, the level of the etched surfaces may be lower than the level of the upper surface of the device isolation layer ST.

Each of the active patterns AP may be formed to have a pillar shape protruding from the upper surface of the substrate 100 in the vertical direction. Each of the active patterns AP may include the first impurity region SD1 and the second impurity region SD2 which are formed at lower and upper levels. Each of the active patterns AP may include an un-doped region, which is interposed between the first impurity region SD1 and the second impurity region SD2 and may be used as the channel region CH.

In some embodiments, the active patterns AP may include the first to fifth active patterns AP1-AP5, which are provided on the PMOSFET region PR. The first and second active patterns AP1 and AP2 may be formed in such a way that a distance therebetween is a first distance P1, the second and third active patterns AP2 and AP3 may be formed in such a way that a distance therebetween is a second distance P2, the third and fourth active patterns AP3 and AP4 may be formed in such a way that a distance therebetween is the second distance P2, and the fourth and fifth active patterns AP4 and AP5 may be formed in such a way that a distance therebetween is a third distance P3. The first, second, and third distances P1, P2, and P3 may be different from each other. For example, the second distance P2 may be greater than the first distance P1. The third distance P3 may be greater than the second distance P2. A distance between adjacent ones of the active patterns AP may be controlled by adjusting a space between the mask patterns MP.

Figure 16A:
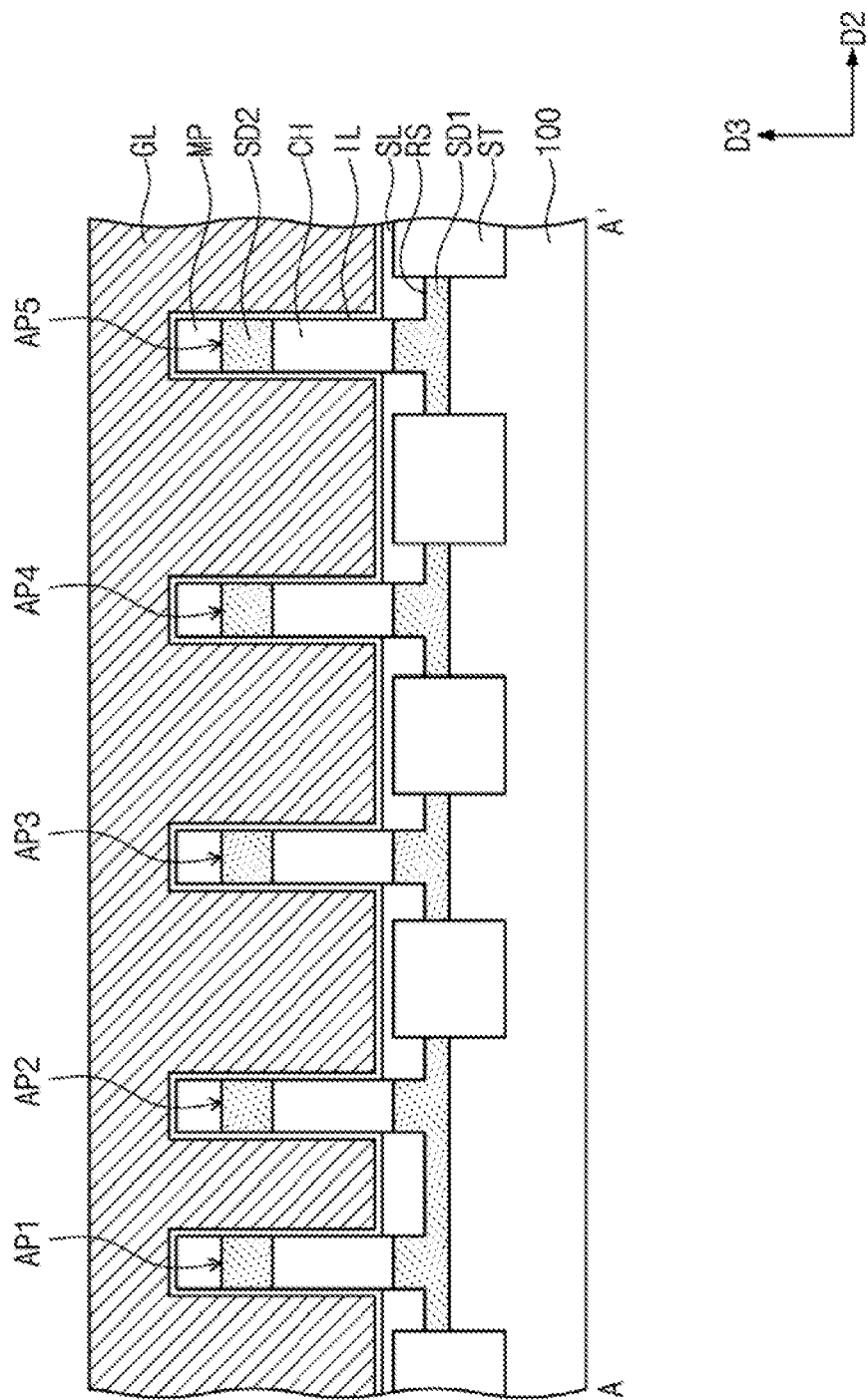
Figure 16B:
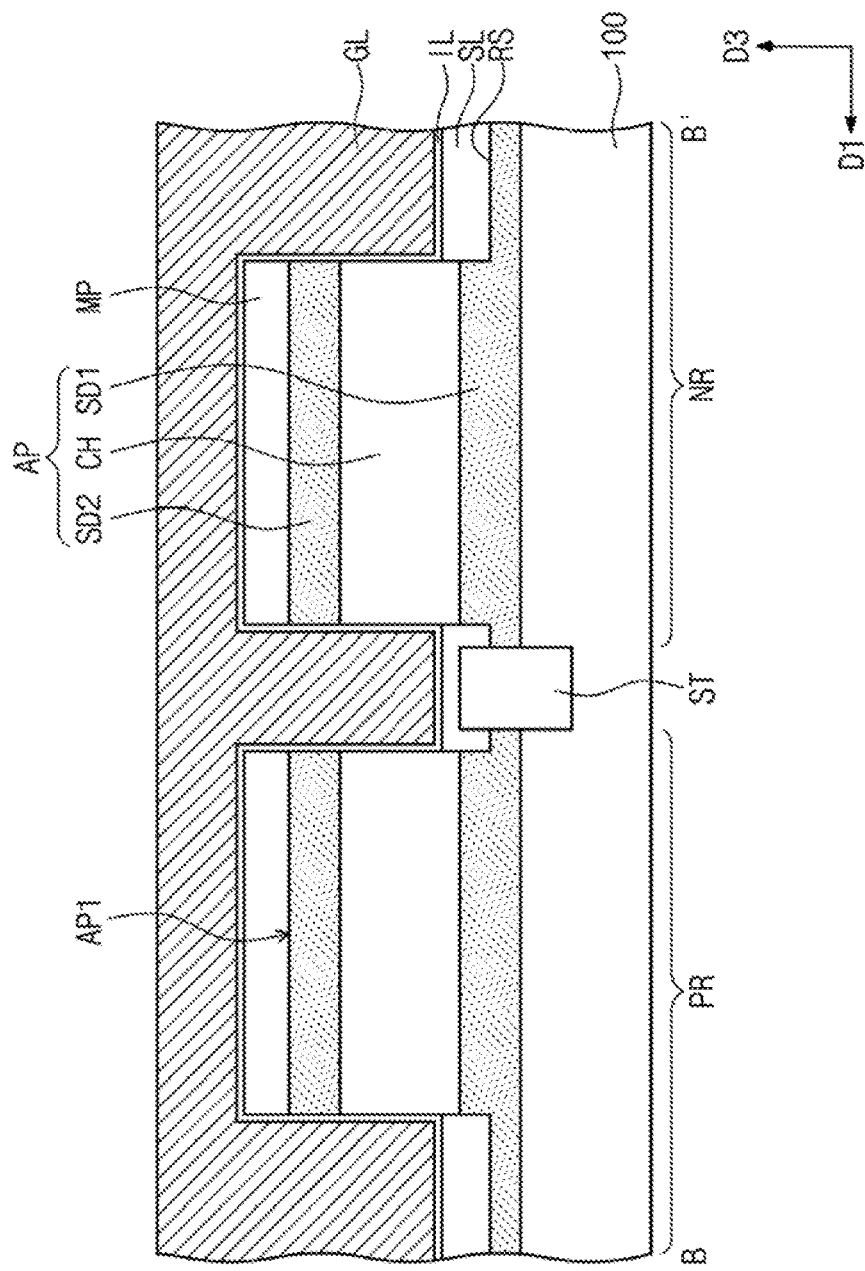

Referring to FIGS. 15, 16A, and 16B, a gate dielectric layer IL and a gate electrode layer GL may be sequentially formed on the substrate 100. The gate dielectric layer IL may be formed to substantially conformally cover the upper surface of the spacer layer SL and the side surfaces of the active patterns AP. The gate electrode layer GL may be formed to fill gap regions between the active patterns AP. The gate dielectric layer IL may be formed using an atomic layer deposition (ALD) or chemical vapor deposition (CM) method. In an embodiment, as shown in FIG. 16A, the gate electrode layer GL may be formed after the gate dielectric layer IL is formed on the surfaces of the spacer layer SL, the channel region CH, the second impurity regions SD2, and the mask patterns MP. The gate dielectric layer IL may be formed of or include a silicon oxide layer, a silicon oxynitride layer, or a high-k dielectric layer. The gate electrode layer GL may be formed of or include at least one of conductive metal nitrides or metals.

Referring back to FIGS. 7, 8A, and 8B, the gate dielectric layer IL and the gate electrode layer GL may be recessed to completely expose the second impurity regions SD2 of the active patterns AP. The mask patterns MP may be removed during or after the recessing of the gate dielectric layer IL and the gate electrode layer GL. After the recessing process, the gate dielectric layer IL and the gate electrode layer GL may be patterned to form the gate dielectric patterns GI and the gate electrodes GE.

The interlayered insulating layer 110 may be formed to cover the active patterns AP and the gate electrodes GE. The interlayered insulating layer 110 may be formed of or include, for example, a silicon oxide layer or a silicon oxynitride layer. The first active contacts AC1 may be formed to penetrate the interlayered insulating layer 110 and may be coupled to the second impurity regions SD2. The second active contacts AC2 may be formed to penetrate the interlayered insulating layer 110 and the spacer layer SL and to be coupled to the first impurity regions SD1. The gate contact GC may be formed to penetrate the interlayered insulating layer 110 and to be coupled to the gate electrode GE. The first active contacts AC1, the second active contacts AC2, and the gate contact GC may be formed using a damascene process. For example, the formation of the first active contacts AC1, the second active contacts AC2, and the gate contact GC may include forming holes to penetrate the interlayered insulating layer 110 and forming the barrier pattern BP and the conductive pattern CP to fill the holes.

Figure 17:
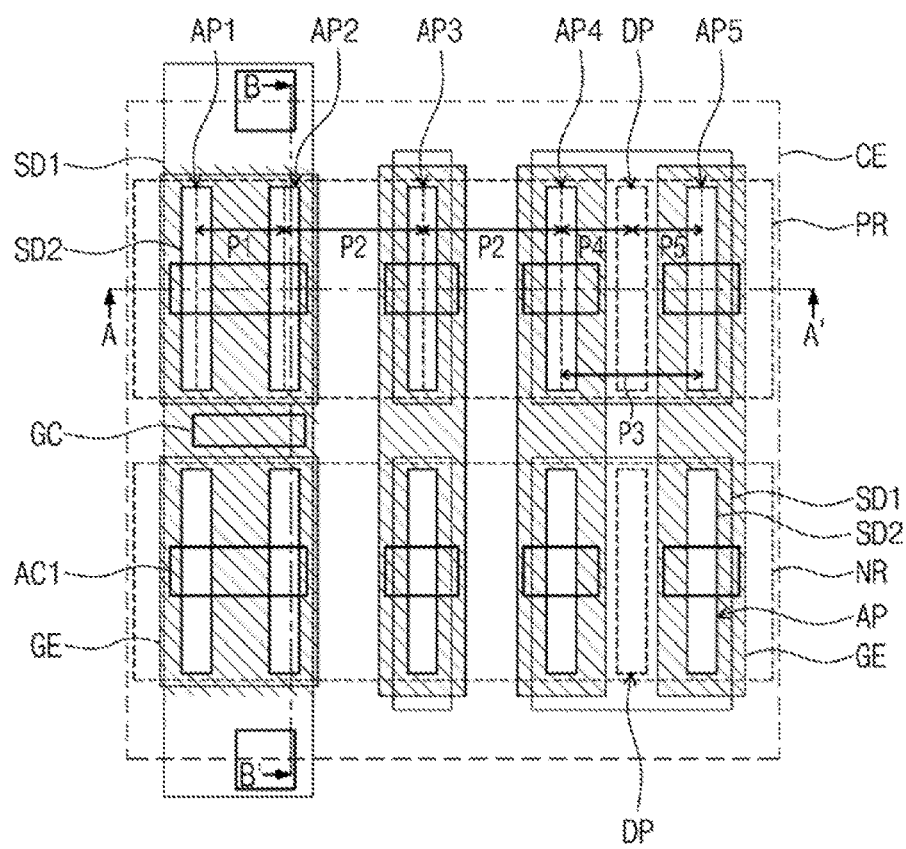
FIG. 17 is a plan view illustrating a semiconductor device according to an exemplary embodiment of the present inventive concept.
Figure 18:
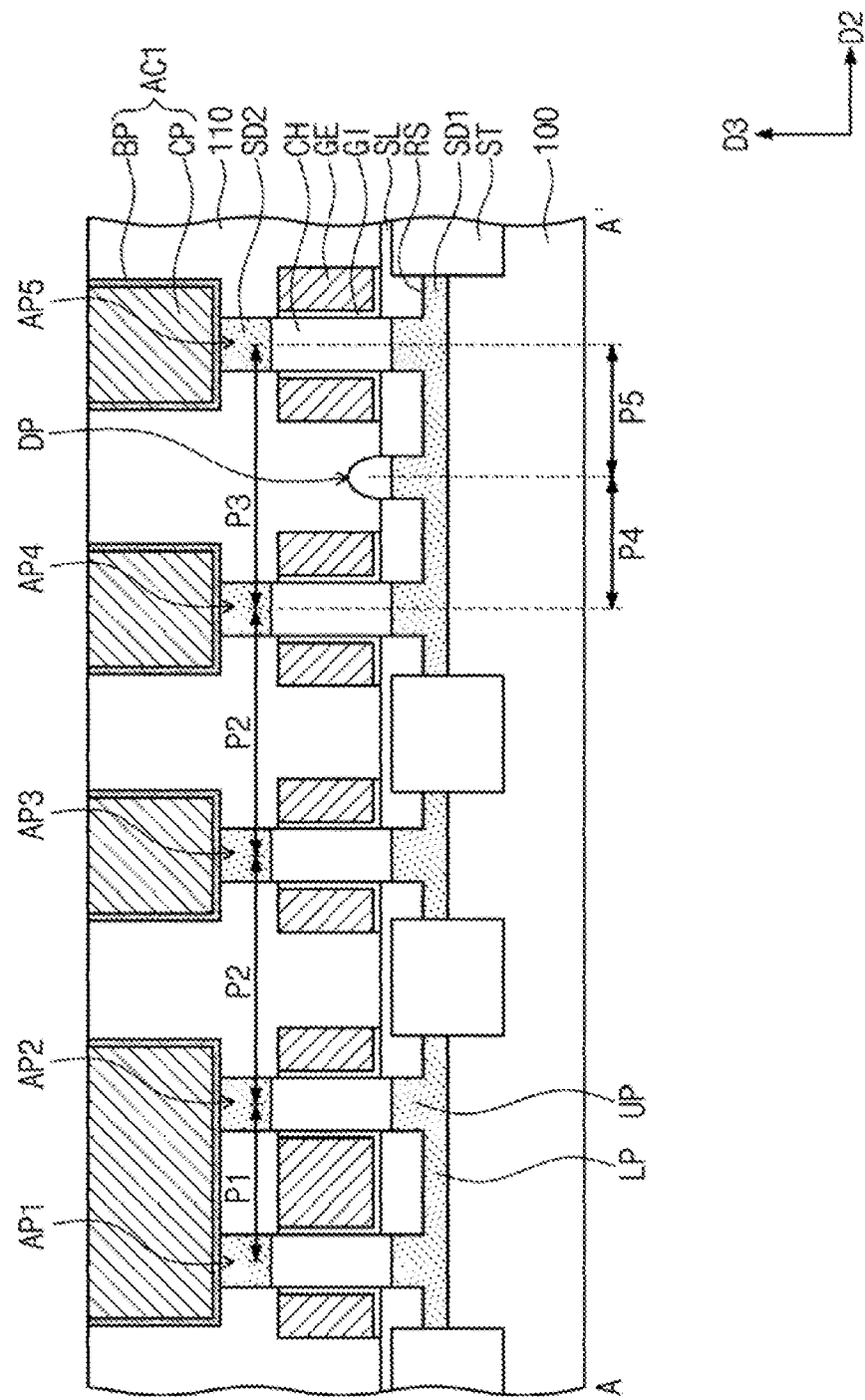
FIG. 18 is a sectional view taken along line A-A' of FIG. 17, according to an exemplary embodiment of the present inventive concept.

Although not shown, on the interlayered insulating layer 110, at least one interconnection layer may be formed to be electrically connected to the first active contacts AC1, the second active contacts AC2, and the gate contact GC. FIG. 17 is a plan view illustrating a semiconductor device according to an exemplary embodiment of the present inventive concept. FIG. 18 is a sectional view taken along line A-A' of FIG. 17. For concise description, an element previously described with reference to FIGS. 7, 8A, and 8B may be designated by a similar or identical reference numeral without repeating an overlapping description thereof.

Referring to FIGS. 17 and 18, dummy patterns DP may be provided on the PMOSFET and NMOSFET regions PR and NR, respectively. As an example, the dummy pattern DP of the PMOSFET region PR may be provided between the fourth and fifth active patterns AP4 and AP5. The fourth and fifth active patterns AP4 and AP5 may be configured to share one of a plurality of the first impurity regions SD1. The dummy pattern DP may be provided to have a vertically-protruding structure, on the first impurity region SD1 between the fourth and fifth active patterns AP4 and AP5. The level of a topmost surface of the dummy pattern DP may be lower than that of the upper surfaces of the active patterns AP. The level of the topmost surface of the dummy pattern DP may be lower than that of the upper surface of the gate electrode GE. The topmost surface of the dummy pattern DP may have a sharp or curved shape. The gate electrode GE may not surround the dummy pattern DP.

A distance between the fourth active pattern AP4 and the dummy pattern DP may be a fourth distance P4. A distance between the dummy pattern DP and the fifth active pattern AP5 may be a fifth distance P5. A sum of the fourth and fifth distances P4 and P5 may be a third distance P3. The fourth distance P4 may be less than the second distance P2, and the fifth distance P5 may be less than the second distance P2. The fourth and fifth distances P4 and P5 may be the same as or different from each other.

In a semiconductor device according to some embodiments of the inventive concept, a distance between an adjacent pair of the active patterns may vary from region to region. Accordingly, by adaptively adjusting distances between the active patterns, it may be possible to reduce an occupying area of the active patterns or a cell area.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
    a substrate with an upper surface and a lower surface;
    first to third active patterns extending from the upper surface of the substrate in a direction perpendicular to the upper surface of the substrate, the first to third active patterns being arranged adjacent to and spaced from each other at a predetermined distance in a first direction;

a first gate electrode surrounding side surfaces of the first and second active patterns; and
a second gate electrode surrounding side surfaces of the third active pattern,
wherein each of the first to third active patterns comprises a first impurity region, a channel region, and a second impurity region that are stacked in the direction perpendicular to the upper surface of the substrate,
a distance between the first and second active patterns is a first distance,
a distance between the second and third active patterns is a second distance, and
the second distance is greater than the first distance; and
a spacer layer interposed in a recess formed between the first and second gate electrodes and the first impurity regions,
wherein the recess is formed in an upper portion of each of the first impurity regions.

2. The device of claim 1, wherein the first impurity regions of the first and second active patterns are connected to each other to be shared by the first and second active patterns.

3. The device of claim 1, further comprising a gate dielectric pattern interposed between each of the first and second gate electrodes and each of the first to third active patterns,
wherein the gate dielectric pattern is in contact with an upper surface of the spacer layer.

4. The device of claim 1, wherein, when viewed in a plan view, at least one of the first impurity regions comprises a portion extending beyond the first gate electrode in a second direction that is perpendicular to the first direction, and
the semiconductor device further comprises an active contact, which is provided to penetrate an interlayered insulating layer and is coupled to the portion of the at least one of the first impurity regions.

5. The device of claim 1, wherein the first to third active patterns have a bar shape extending in a second direction that is perpendicular to the first direction.

6. The device of claim 1, further comprising a fourth active pattern disposed adjacent to the third active pattern at a predetermined gap in the first direction,
wherein a distance between the third and fourth active patterns is a third distance, and
the third distance is greater than the second distance.

7. The device of claim 6, further comprising a dummy pattern disposed between the third and fourth active patterns,
a level of a topmost surface of the dummy pattern is lower than a level of upper surface of the first to fourth active patterns,
a distance between the third active pattern and the dummy pattern is a fourth distance,
a distance between the fourth active pattern and the dummy pattern is a fifth distance,
the second distance is greater than the fourth distance, and
the second distance is greater than the fifth distance.

8. A semiconductor device, comprising:
a first active pattern, a second active pattern, a third active pattern, and a fourth active pattern on a substrate;
a first gate electrode surrounding side surfaces of first and second active patterns;
a second gate electrode surrounding side surfaces of the third active pattern; and
a third gate electrode surrounding side surfaces of the fourth active pattern,
wherein the first, second, third, and fourth active patterns are adjacent to each other in a first direction,
each of the first to fourth active patterns comprises an upper impurity region protruding above the first to third gate electrodes in a direction perpendicular to the substrate,
a distance between the first and second active patterns is a first distance,
a distance between the third and fourth active patterns is a second distance, and
the second distance is greater than the first distance; and
a spacer layer interposed in a recess formed between the first to third gate electrodes and the upper impurity regions of the first to fourth active patterns,
wherein the recess is formed in each of the upper impurity regions of the first to fourth active patterns.

9. The device of claim 8, wherein a lower impurity regions of the first and second active patterns are connected to each other to form one lower impurity region.

10. The device of claim 8, wherein the spacer layer covers lower impurity regions of the first to fourth active patterns,
wherein the spacer layer is disposed to expose channel regions of the first to fourth active patterns, and
the first to third gate electrodes are disposed on the spacer layer to surround the channel regions.

11. The device of claim 10, further comprising one or more gate dielectric patterns disposed between the first to third gate electrodes and the channel regions of the first to fourth active patterns, and between the first to third gate electrodes and an upper surface of the spacer layer.

12. The device of claim 8, further comprising a dummy pattern disposed between the third and fourth active patterns,
wherein a level of a topmost surface of the dummy pattern is lower than levels of upper surfaces of the first to fourth active patterns,
a distance between the third active pattern and the dummy pattern is a third distance,
a distance between the fourth active pattern and the dummy pattern is a fourth distance,
the second distance is greater than the third distance, and
the second distance is greater than the fourth distance.

13. A semiconductor device, comprising:
a substrate with an upper surface and a lower surface;
a first region including a first to fifth active patterns arranged adjacent to and spaced from each other at a predetermined distance in a first direction;
a second region including a sixth to tenth active patterns arranged adjacent to and spaced from each other at a predetermined distance in the first direction, the second region spaced from the first region in a second direction;
a first gate electrode surrounding side surfaces of the first, second, sixth, and seventh active patterns;
a second gate electrode surrounding side surfaces of the third and eighth active patterns;
a third gate electrode surrounding side surfaces of the fourth and ninth active patterns, and
a fourth gate electrode surrounding side surfaces of the fifth and tenth active patterns,
wherein each of the first to fifth active patterns and the sixth to tenth active patterns comprises a first impurity region, a channel region, and a second impurity region that are stacked in a direction perpendicular to the upper surface of the substrate, and wherein the first to fourth active patterns and the fifth to eighth active patterns are extending in a third direction which is perpendicular to the first and second direction.

14. The semiconductor device of claim 13, wherein the first region comprises one of a PMOSFET region or a NMOSFET region, and the second region comprises the other of the PMOSFET region or the NMOSFET region.

15. The semiconductor device of claim 13, further comprising a gate contact disposed between the first region and the second region when viewed in the third direction.

16. The semiconductor device of claim 15, wherein the first gate electrode overlaps the gate contact when viewed in the third direction.

* * * * *